USO05144548A

United States Patent [19]

Salandro

[11] Patent Number: 5,144,548
[45] Date of Patent: Sep. 1, 1992

[54] ROUTING SWITCHER

[75] Inventor: Jerry R. Salandro, Greensburg, Pa.

[73] Assignee: IRIS Technologies, Inc., Greensburg, Pa.

[21] Appl. No.: 379,097

[22] Filed: Jul. 13, 1989

Related U.S. Application Data

[63] Continuation-in-part of Ser. No. 320,402, Mar. 8, 1989, abandoned, which is a continuation of Ser. No. 219,592, Jul. 15, 1988, abandoned.

[51] Int. Cl.$^5$ .................. G05B 19/42; G05B 15/02; H04Q 19/00
[52] U.S. Cl. ................. 364/138; 340/825.83; 364/191
[58] Field of Search ... 364/188, 138, 140, 900 MS File, 364/191; 340/825.83; 357/45; 370/60.1, 54, 94.3, 62; 379/92, 96, 53

[56] References Cited

U.S. PATENT DOCUMENTS

| | | |
|---|---|---|
| 2,788,471 | 4/1957 | Fulmer . |
| 3,659,205 | 4/1972 | Cooke et al. . |
| 3,680,005 | 7/1972 | Jorgensen et al. . |
| 3,891,815 | 6/1975 | Hiele . |
| 3,992,686 | 11/1976 | Canning . |
| 4,045,750 | 8/1977 | Marshall . |
| 4,120,732 | 12/1978 | Wakeling . |
| 4,362,899 | 12/1982 | Borrill . |
| 4,739,448 | 4/1988 | Rowe et al. . |
| 4,754,326 | 6/1988 | Kram et al. ............ 364/900 |
| 4,907,079 | 3/1990 | Turner et al. ............ 379/92 |
| 4,974,252 | 11/1990 | Osborne ............ 379/92 |
| 5,014,267 | 5/1991 | Tompkins et al. ............ 370/62 |

OTHER PUBLICATIONS

Defensive Publication T941,006, entitled: Electrical Impulse Divider Module with Printed Circuit Interconnect Matrix, by: Richard G. Farnsworth, York, Maine, published: Dec. 2, 1975.

Turkovsky et al., A Primer on Routing Switchers, Sound & Video Contractor, Dec. 20, 1988, pp. 32-40.

Primary Examiner—Jerry Smith
Assistant Examiner—Jim Trammell
Attorney, Agent, or Firm—Richard V. Westerhoff

[57] ABSTRACT

A computer routing band switcher is controlled by icons on a display screen which are programmable to represent any one of a number of devices, which can have multiple inputs and outputs, connected to a crosspoint switching matrix. Routing is implemented by selection through use of a touch screen or a mouse of an icon representing a desired source device followed by one or more icons representing desired destination devices. In response to inputs through use of the icons, the computer generates control signals for the switching matrix which, instead of cables, utilizes printed circuit boards with a high density pattern of input and output signal tracks separated by shielding tracks and selectively interconnected by a plurality of modular crosspoint switching units arranged together with the output tracks in groups, with only one unit in each group connected to any one input track, but with all of the units in each group connected to all of the output tracks. Additional functions such as adding or deleting devices from a signal route, patching a device into a signal route, storing and implementing frequently used signal routes, breaking away to other sources, either for video and or one or more audio channels, and controlling devices, are all implemented through manipulation of icons.

20 Claims, 23 Drawing Sheets

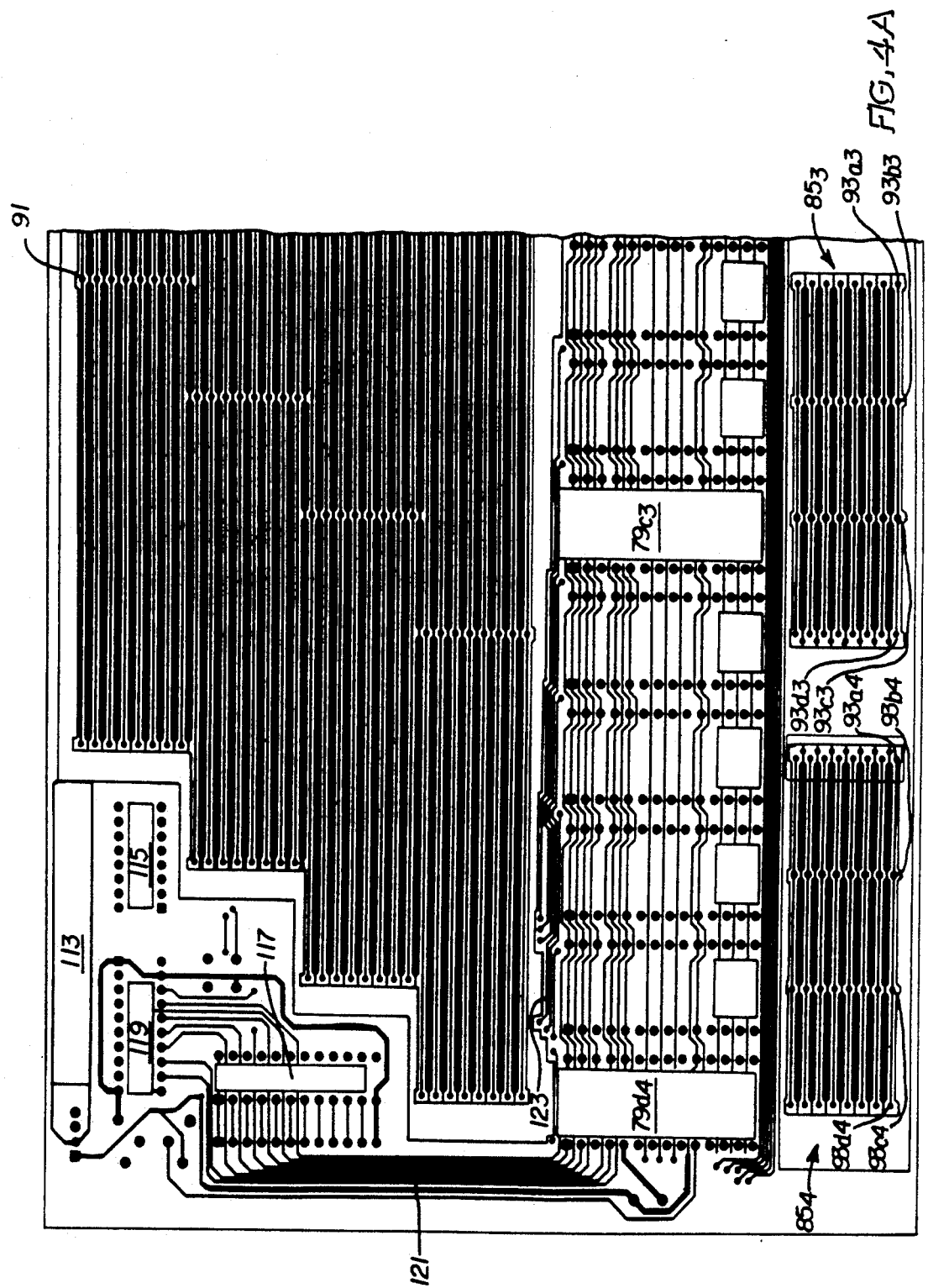

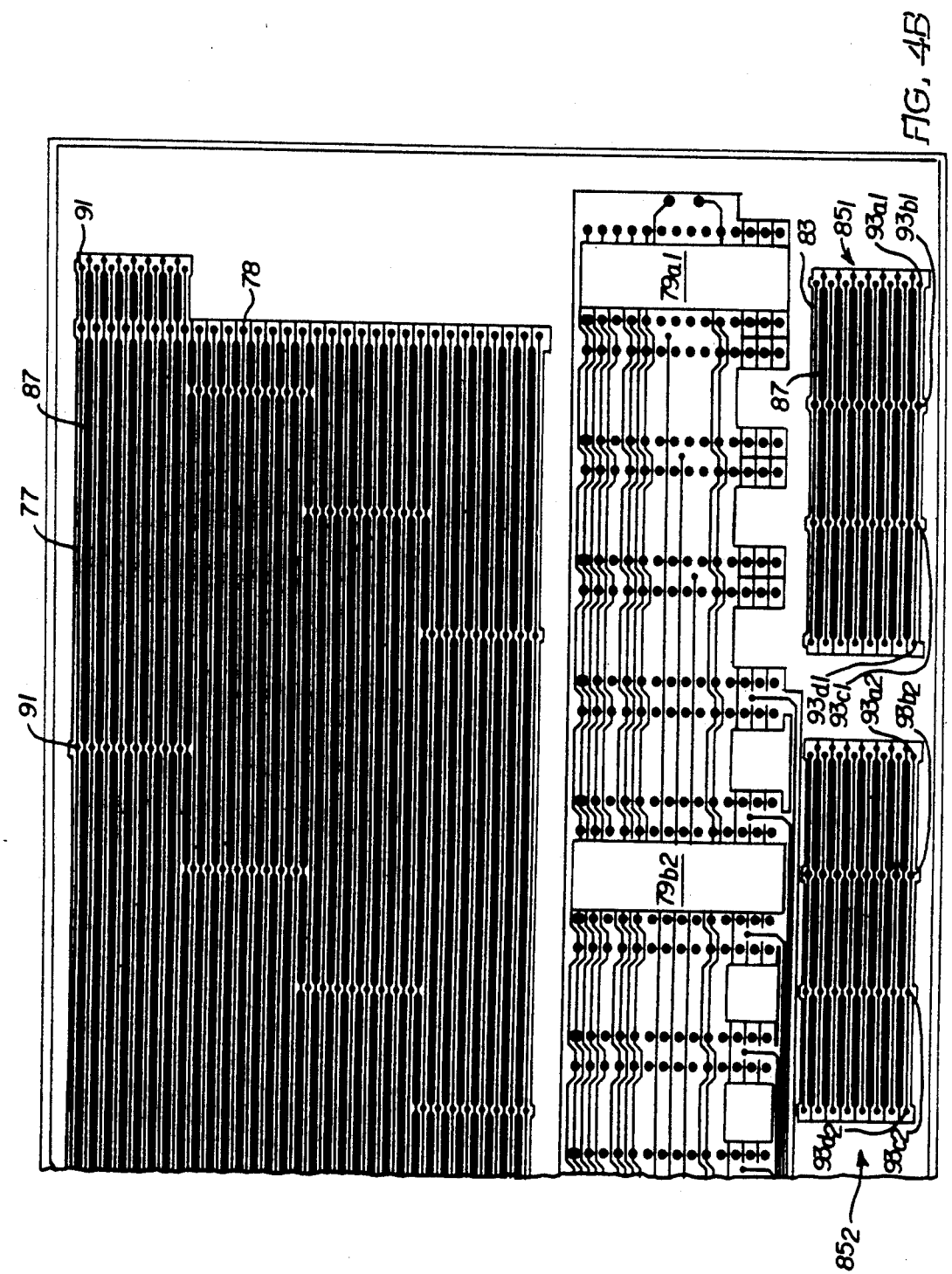

*139* Complete

*123*

*137*

Name [ Beta ] [ / ] [ ] VCR [ ]
Is device patchable [ ]

|  |  | PRT | BD | CH |  | PRT | BD | CH |
|---|---|---|---|---|---|---|---|---|
| Red | In | [0] | [0] | [0] | Out | [0] | [0] | [0] |
| Green | In | [0] | [0] | [0] | Out | [0] | [0] | [0] |
| Blue | In | [0] | [0] | [0] | Out | [0] | [0] | [0] |
| Composite/Sync | In | [ ] | [1] | [ ] | Out | [ ] | [1] | [1] |
| Left | In | [ ] | [2] | [ ] | Out | [ ] | [2] | [1] |
| Right | In | [ ] | [3] | [ ] | Out | [ ] | [3] | [1] |

*141* Exit Without Set-Up

FIG. 10

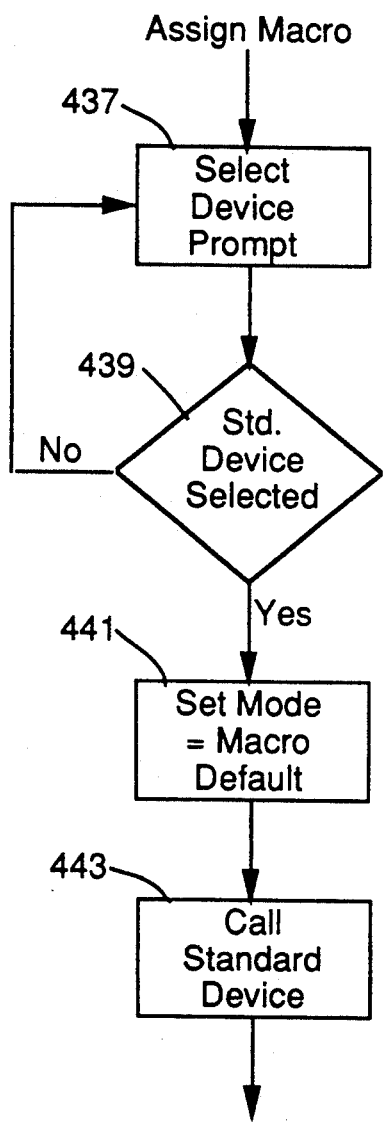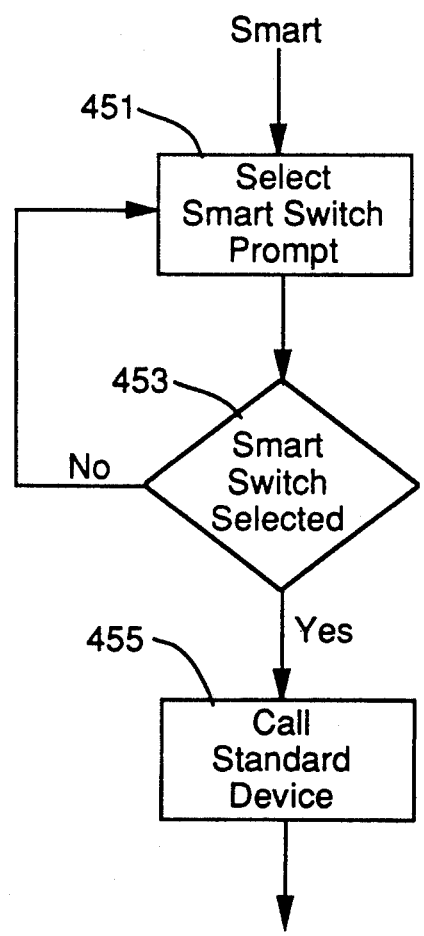
FIG. 33
FIG. 34

ROUTING SWITCHER

CROSS REFERENCE TO RELATED APPLICATIONS

This application is a continuation-in-part of application Ser No. 07/320,402 entitled "Shielded Multi-Channel Printed Circuit Board" filed on Mar. 8, 1989 which is a continuation of application Ser. No. 07/219,592 of the same title filed Jul. 15, 1988 and both now abandoned.

NOTICE OF COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records but otherwise reserves all copyright rights whatsoever.

BACKGROUND OF INVENTION

1. Field of the Invention

This invention relates to routing apparatus utilizing cross-point switches for directing any one of a number of electrical signals on a plurality of input channels to any one or more of a number of output channels. More particularly, it relates to a computer controlled routing switcher in which flexible routing is directed through the manipulation of icons on a computer display. The invention also relates to the circuit boards on which switching of the signals is implemented. It has particular application to routing television and audio signals.

2. Background Information

There are many applications where it is desirable to be able to switch signals on any one of a number of input channels to any one or more of a number of output channels. One such application is routing switchers used to interconnect large numbers of video and/or audio devices. Such routing switchers may be used for instance to switch from one camera to another or to a VCR, or to switch from one audio source to another, or to special effects, either simultaneously with, or separately from the video, in creating programs or in multimedia presentations. Routing switchers can also be used in selecting from among a number of cameras and listening devices or other sensors located throughout a building or a facility for monitoring activities.

Routing switchers typically use cross-point switching matricies to interconnect the various inputs with the outputs. Presently available routing switchers use mechanical switches or push buttons to make the interconnection selections. Such devices are hardwired to the matrix terminals, and thus the configuration cannot be easily changed. Also, when switching video and audio signals, shielding must be provided to prevent cross talk. Currently available routing switchers typically use shielded cable to connect the inputs and outputs with the cross-point switching matrix. This makes such systems bulky. The result is that the available routing switchers are large, inflexible, and expensive.

There is a need therefore for a routing switcher in which the configuration can be easily changed, and which is preferably programmable.

There is also a need for a more compact routing switcher, and preferably one which provides the required shielding for the audio and video signals without the need for shielded cable.

There is a related need for a routing switcher in which a number of cross-point switching modules can be mounted on a single printed circuit board.

There is a further need for a routing switcher which can provide enhanced features over those available in the present systems in which user input is made through mechanical switches or push buttons.

There is another need for such a routing switcher with enhanced features which is easy to use.

There is an additional need for such a routing switcher which can switch multi-channel signals with a single input.

There is yet another need for such a routing switcher which clearly identifies each separate signal route.

There is also a need for such a routing switcher which has the capability of storing signal routes which can then be implemented with minimum input.

There is also need for such a routing switcher which has the capability of breaking away one or more channels for selected devices to other sources and which clearly identifies to the user the breakaway status.

There is an additional need for such a routing switcher which can easily patch signals through selected components.

SUMMARY OF THE INVENTION

These and other needs are satisfied by the invention which is directed to a routing switcher which includes a printed circuit board arrangement having a plurality of modular cross-point switching units making up the switching matrix. These switching units are arranged in groups on a printed circuit board. Tower signal tracks connect the inputs of each group of cross-point switching units with each of a plurality of input channel signal tracks on the circuit board, but with only one cross-point switching unit in each group connected to any one input channel signal track. Multiple channel output signal tracks are arranged in sets with one set of output channel signal tracks associated with each one of the groups of cross-point switching units. Connecting signal tracks on the board connect each output channel signal track for each set of output channel signal tracks to an output of each cross-point switching unit in the associated group, such that any one of the input channel signal tracks is connectable to any one of the output channel signal tracks through one of the cross-point switching units. Common shielding tracks individually surround and separate each of the signal tracks on the board from each other so that the signal tracks can be closely spaced without cross talk.

The input channel signal tracks are substantially straight and run parallel to each other longitudinally along the board. The sets of output channel signal tracks are aligned longitudinally on the same side of the board, and run parallel to the input channel signal tracks. The tower signal tracks and connecting signal tracks are on the opposite side of the board and run perpendicular to the input and output channel signal tracks, and are connected thereto through plated through holes. The cross-point switching units are aligned longitudinally on the board between the input signal tracks and output signal tracks and also communicate with the tower signal tracks and input signal tracks through plated through holes. Control signal tracks for the cross-point switching units also run longitudinally along the board.

The printed circuit board with the cross-point switching units is sandwiched with a driver board with interboard connectors directly connecting each signal channel on the switching board individually with a signal channel on the driver board. The driver board has an edge connector which mates with a connector on a terminal board which has individually shielded signal tracks connecting each pin of the connector with a terminal. This provides a compact arrangement without cross talk and eliminates the need for connecting cables. Several switching matrix board and driver board sandwiches can be connected to the terminal board in a similar manner.

The invention is also directed to a computer based routing switcher in which sophisticated switching functions are implemented easily through manipulation of icons on a display screen, preferably through the use of a touch screen or mouse input device. The display includes an array of programmable device icons which may be individually assigned to a device having a number of input channels and a number of output channels connected to selected terminals on the terminal board. For instance, a VTR may have four channel video and left and right audio input and output channels. The title of the device appears on the assigned device icon.

In preforming a routing job using the touch screen as the input device, the user merely touches the devices which are to be connected. The first device icon touched identifies the source device for a signal route. All additional device icons touched identify destination devices for that signal route. The computer then generates control signals operating the cross-point switching matrix to connect the input terminals to which the source channels of the source device are connected to the output terminals to which the destination channels of the destination devices are connected. These signals are buffered until a job complete icon is touched to close out the designated signal route. Multiple signal routes can be implemented in a similar manner.

As another feature of the invention, indicia are provided on the display to differentiate the various signal routes. In the exemplary system, this is implemented by uniquely color coding the device icons representing the devices in each signal route. In addition, the titles of the source devices are displayed in white while those of the destination devices are shown in black.

Devices may be eliminated from a signal route merely by retouching the icon assigned to the device to be eliminated. A signal route may be expanded by touching an "append" icon identifying the route to be appended by touching the source icon of that route, and then touching the icons of the destination devices to be added to the signal route.

Frequently used signal routes can be stored and implemented by entering a "macro" mode. The stored signal route can be selected from a list of macros, or can be assigned to a "smart" icon. A smart icon is a device icon which has also been assigned to a specific macro or stored signal route. This smart icon performs its normal function as a source and/or destination icon until the smart function is enabled by selection of a smart enable icon. Then selection of the smart icon implements the stored signal route without the need for touching each of the icons associated with the devices in the stored signal route.

The invention also provides the capability of patching a signal route through a device such as a title generator, audio fader, et cetera. Selection of a "patch" icon followed by the icon of the source to be patched, and then the patch device, causes the computer to generate control signals for the switching matrix disconnecting the source terminals from the destination terminals and instead routing the source signals through the patch device before being sent to the destination terminals.

An additional feature of the invention is an easily implemented breakaway function. Selection of a "breakaway" icon and a source icon for the break away, calls up a breakaway display which permits the user to select any combination of video, audio left and audio right channels for breakaway. The computer will then generate signals switching the selected channels of selected destination devices to the breakaway source. The breakaway source and portions of the device icon representing the channels broken away are given a unique color to identify the change in source.

The invention provides a very flexible, easily used routing switcher. Menus and prompts are used extensively to advise the user of the options available and to provide guidance in carrying out the various switching functions. The displays are organized to continuously present a comprehensive, easily understood, picture of the switching functions which have been implemented.

BRIEF DESCRIPTION OF THE DRAWINGS

A full understanding of the invention can be gained from the following description of the preferred embodiments when read in conjunction with the accompanying drawings in which:

FIGS. 4A and 4B when placed side by side illustrate a plan view of the component side of a printed circuit board implementing the switching matrix in accordance with the invention.

FIG. 10 illustrates the setup display.

FIGS. 16 through 34 illustrate flowcharts for a suitable computer program implementing the invention.

DESCRIPTION OF THE PREFERRED EMBODIMENTS

Figure 1:
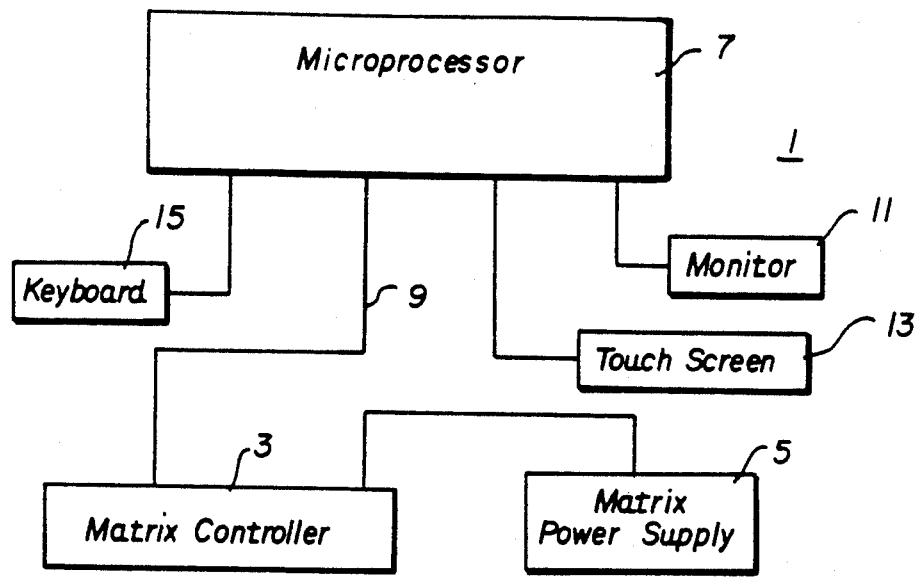
FIG. 1 is a schematic diagram in block diagram form illustrating a routing switcher in accordance with the invention.

Referring to FIG. 1, the routing switcher 1 of the invention includes a matrix controller 3 powered by a power supply 5 and controlled by a digital computer 7, such as a PC with an XT microprocessor and 256k of memory, through a cable 9 connected between parallel ports in the controller and the computer. The user interfaces with the computer 7 through a color monitor 11, which in the preferred embodiment is provided with a touch screen 13. Alternatively, a mouse can be used as an input device in place of the touch screen 13. A keyboard 15 is also provided for inputting information into the computer.

The routing switcher of the invention can be used in a variety of applications, and with a variety of devices. The invention will be described as used for routing signals between video and audio devices such as might be used in a studio for generating video programs. It will be appreciated by those skilled in the art, however that the invention can also be used for instance with a security system, or in generating a multi-media presentation.

Figure 2:
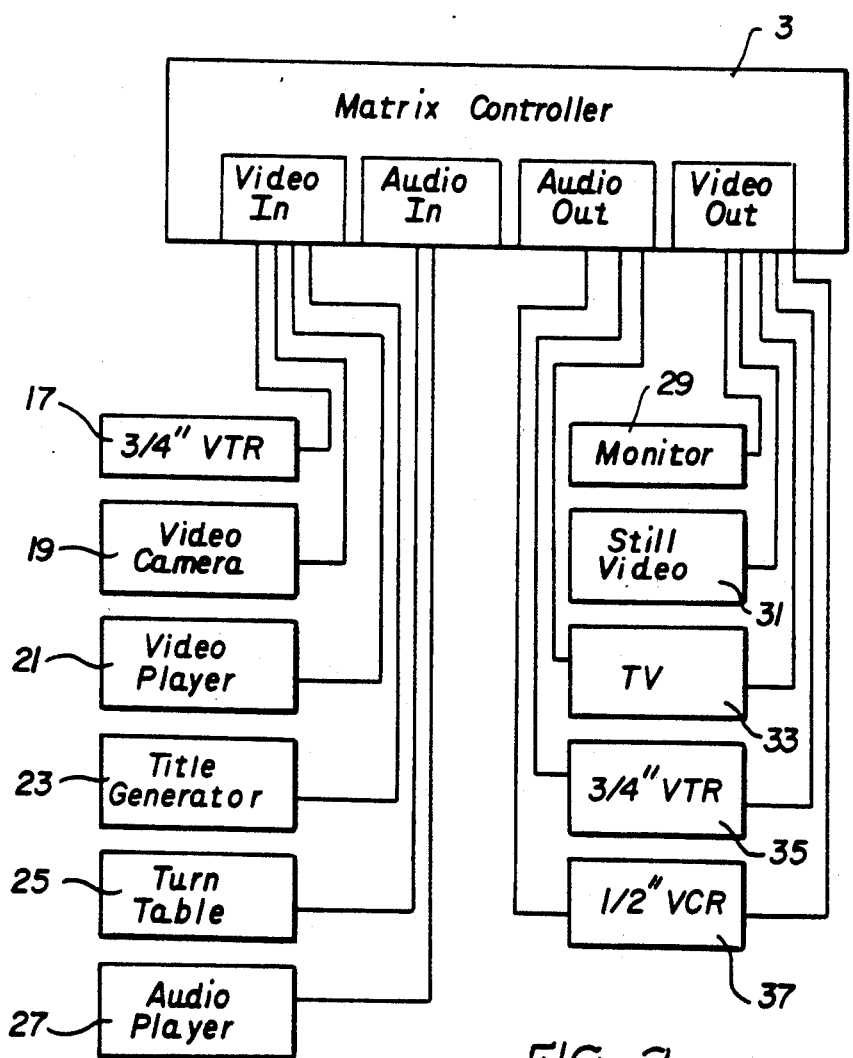
FIG. 2 is a schematic diagram in block diagram form illustrating an exemplary arrangement of devices to be controlled by the routing switcher of the invention.

The basic matrix controller unit 3 has 96 terminals which can be apportioned for various combinations of video and audio inputs and outputs. As will be discussed later, additional units can be stacked and linked together if additional terminals are required. By way of example only, FIG. 2 illustrates a matrix controller 3 having a VTR 17, video camera 19, video player 21, and a title generator 23 connected to video inputs, and a turn table 25 and an audio player 27 connected to audio inputs. A monitor 29, a still video 31, a TV 33, a VTR 35 and VCR 37 are connected to video outputs. The TV 33, VTR 35 and VCR 37 also receive audio outputs from the matrix controller 3. The matrix controller 3 routes video and audio signals from the input devices to one or more of the output devices in response to commands input tot he computer by an operator through the touch screen 13.

Figure 3:
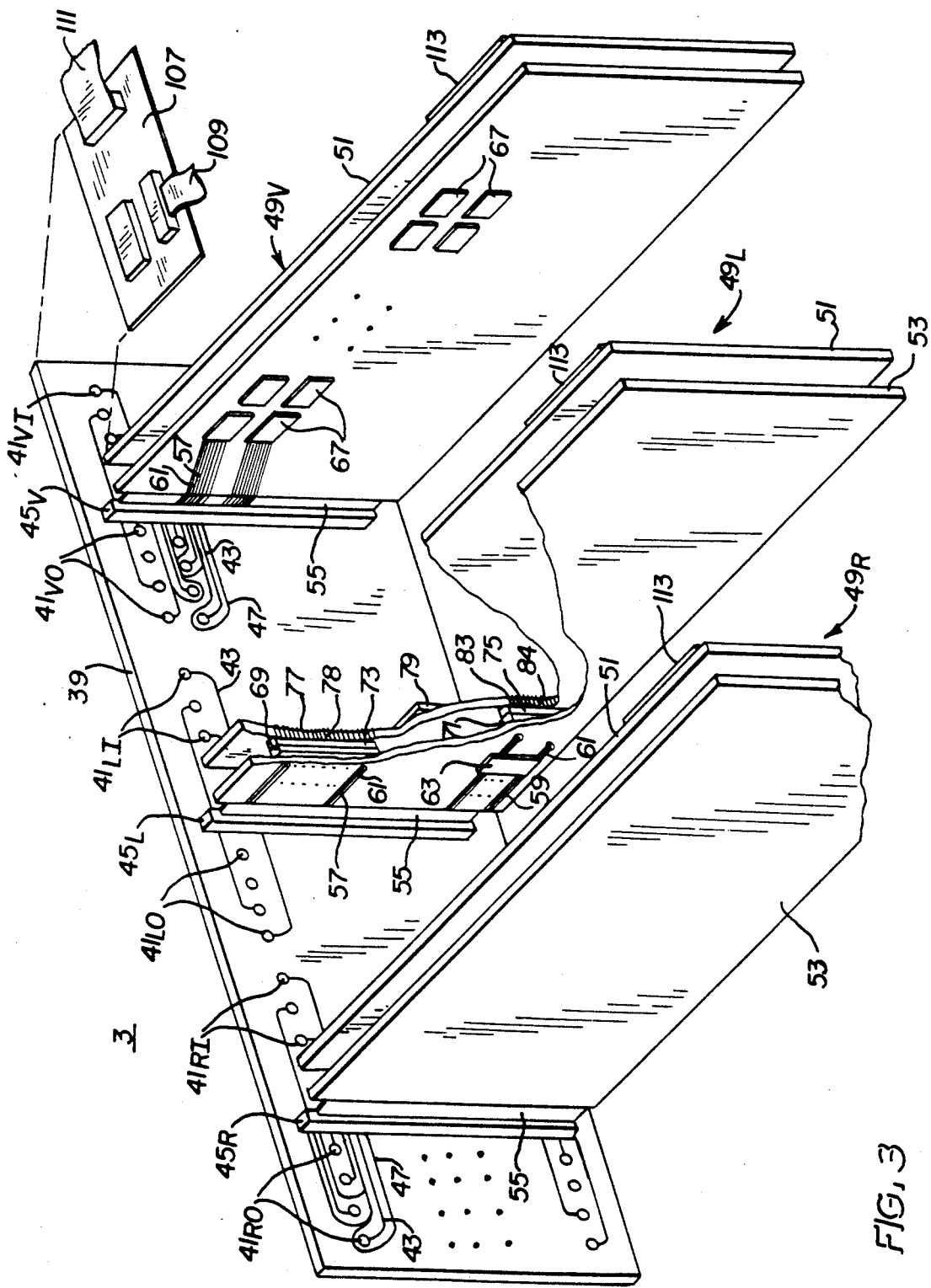
FIG. 3 is an isometric view of the arrangement of circuit boards in a matrix controller which forms a part of the routing switcher of the invention.

FIG. 3 illustrates the arrangements of the circuit boards in a typical matrix controller 3. A terminal board 39 supports an array of terminals 41 through which the devices, such as those shown in the example of FIG. 2, may be connected to the routing switcher. Each of the terminals 41 is connected through a signal track 43 on the terminal board 39 to one of 3 female edge connectors 45. In the exemplary matrix controller designed for handling 32 video inputs and 32 video outputs, and 32 inputs and 32 outputs each for left and right audio channels are grouped with all the video input terminals $41_{VI}$ and the video output terminals $41_{VO}$ connected to the edge connector $45_V$. The left channel audio input terminals $41_{LI}$ and the left audio output terminals $41_{LO}$ are connected to the connector 41L. Similarly, the right audio channel input terminals $41_{RI}$ and output terminals $41_{RO}$ are connected to the connector 45R. Each of the signal tracks 43 is substantially surrounded by a grounded shielding track 47. Only a few of the signal tracks and shielding tracks are shown on terminal board 39 for clarity.

Three board assemblies $49_V$, $49_L$ and $49_R$ are plugged into the corresponding connector 45. Each board assembly 49 includes a matrix board 51 and a driver board 53. The driver board 53 has an edge connector 55 which mates with the associated connector 45 on the terminal board to mount the board assembly 49 perpendicular to the terminal board 39. The driver board has a number of input signal tracks 57 and output signal tracks 59, each substantially separated by shielding tracks 61. Driver circuits 63 boost the signals on the output tracks 59. For the video signals, driver circuits 67 are also provided in the input tracks 57. The input signal tracks 57 are connected through plated through holes to a connector 69 on the opposite side of the driver board. The output tracks 59 are similarly connected to one of four connectors 71 (only one shown in FIG. 3) on the opposite side of the driver card 53. The connector 69 mates with a connector 73 on the matrix board 51 while the output signals are received from the matrix board 51 through connectors 75 on the matrix board which mate with the connectors 71 on the driver board. With this arrangement, signal tracks on the two boards are connected directly to each other without the need for shielded cable since the connectors themselves provide shielding at the interface.

Figure 5A:
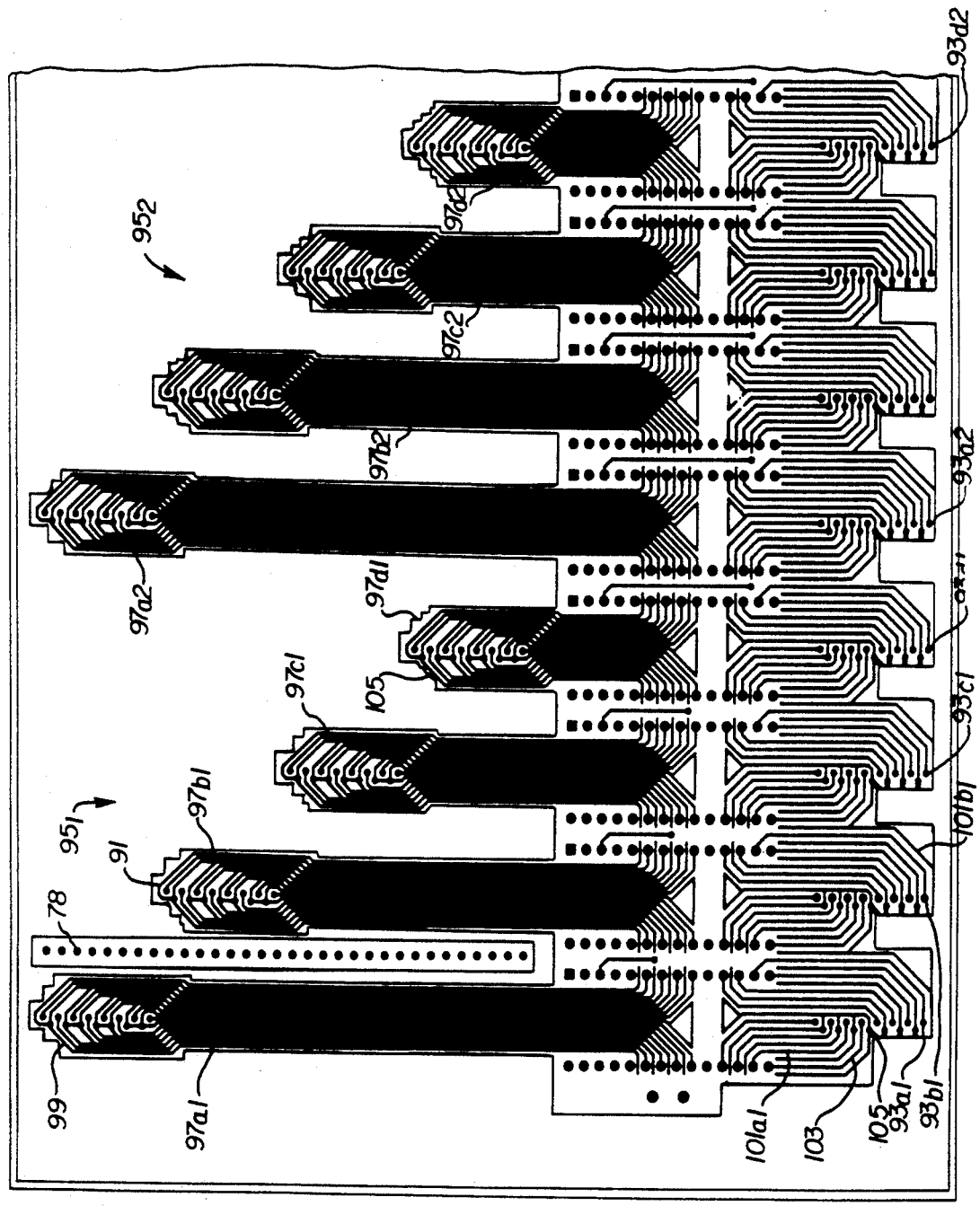
FIGS. 5A and 5B when placed side by side illustrate a plan view of the reverse side of the printed circuit board of FIG. 4.
Figure 5B:
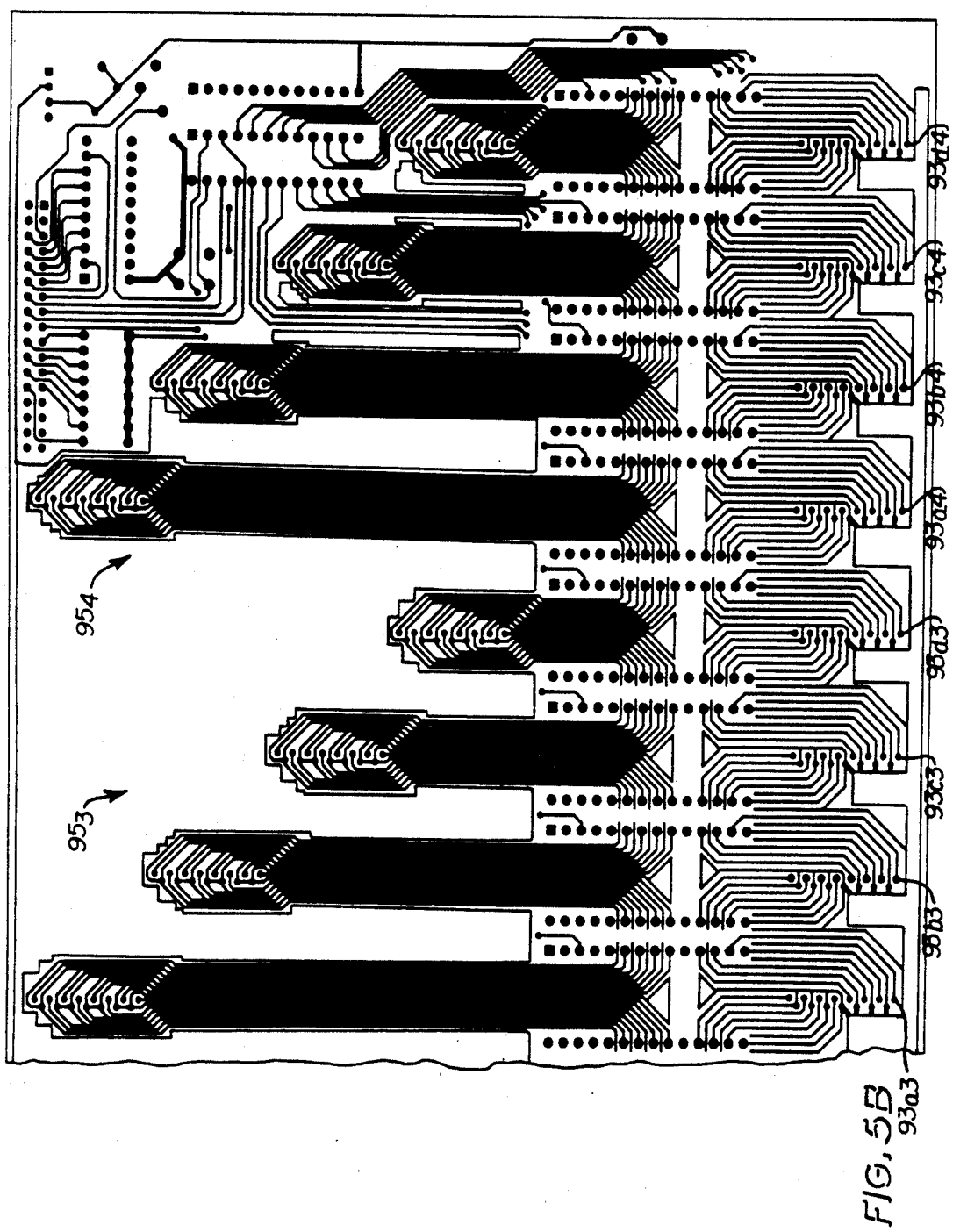
Figure 6:
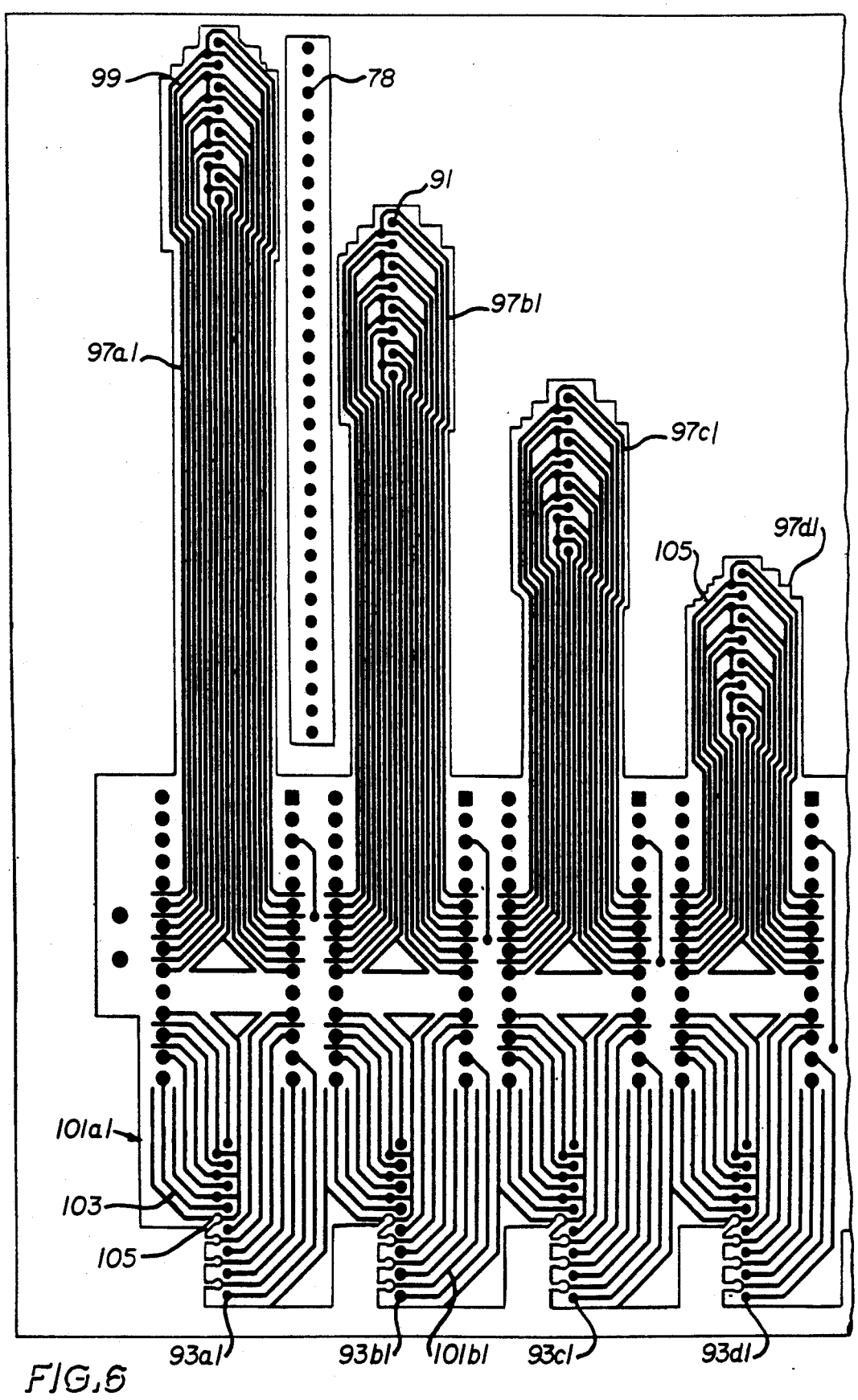
FIG. 6 is an enlarged view of a section of the printed circuit board of FIG. 5A.

The matrix boards 51 are shown in greater detail in FIGS. 4 through 6. On the first side of the board shown in FIG. 4, there are 32 parallel input channel signal tracks 77 extending longitudinally along the top of the board. Next to the input channel signal tracks 77 are 16 cross-point switching units 79 aligned longitudinally along the board 51. Each of the cross-point switching units 79 has eight signal channel inputs and eight signal channel outputs and includes a 64 point matrix capable of connecting any one of the input channels to any one of the output channels. Suitable cross-point switching devices 79 are MT8809. The cross-point switching units 79 are mounted on the board 51 by pins on the unit which are soldered in holes 81 through the board 51. Many of the cross-point switching unit 79 have been removed in FIG. 4 to reveal underlying circuit tracks.

Below the cross-point switching units 79 on the first side of the matrix board 51, are 32 output channel signal tracks 83 arranged in four sets 85 of eight tracks each with the four sets longitudinally aligned.

Each of the input channel signal tracks 77 and output channel signal tracks 83 are substantially surrounded by shielding signal tracks 87 which are interconnected through the large clear areas between the groups of signal tracks and connected to a single output point 89 to which a negative shielding voltage is applied (from the power supply 5).

Each of the input channel signal tracks 77 is connected to one of the socket in the connector 73 through a plated through hole 78. In addition, each input channel track 77 has four spaced apart plated through holes 91. Similarly, each of the output channel signal tracks 83 on the matrix board 51 is connected to a pin in a connector 75 through a plated through hole 84. Each of the output channel signal tracks 83 also has four spaced apart plated through holes 93.

Turning to FIGS. 5 and 6, it can be seen that the other side of the matrix board 51 has four sets 95 of tower signal tracks 97. Each set 95 of tower signal tracks includes four groups 97 of eight tower tracks each, which are each connected through the plated through holes 91 with eight of the input channel signal tracks 77 on the first side of the matrix board. Each group 97 of tower signal tracks is connected with a separate group of eight input channel signal tracks 77 so that one tower signal track in each set 95 of tower signal tracks is connected to one of the input channel signal tracks 77. Each tower signal track 99 in each group $97_a$, $97_b$, $97_c$ and $97_d$ is connected to one of the eight signal inputs to a corresponding one of four cross-point switching units 79$_a$, 79$_b$, 79$_c$ and 79$_d$. Thus, each of the input channel signal tracks 77 is connected through a tower signal track 99 to one, but only one, of the signal inputs to one of a group of four cross-point switching units 79. This pattern is repeated for each of the sets 1 through 4 of the sets 95 of tower tracks so that each input channel signal track 77 is connected to one of the inputs of one cross-point switching unit 79 in each group of four such units.

Each of the sets 85$_1$ through 85$_4$ of eight output channel signal tracks 83 is connected through a set of plated through holes 93 with a set 101 of eight connecting signal tracks 103 on the second side of the matrix board 51, which in turn are each connected to the eight signal outputs of each of the four cross-point switching units in a group of four cross-point switching units 79a through 79$_d$.

As with the input channel signal tracks 77 and the output channel signal tracks 83, each of the tower signal tracks 99 and connecting signal tracks 103 is substantially surrounded by a shielding track 105. It can be seen that the tower signal tracks and the connecting signal tracks on the second side of the matrix board 51 are perpendicular to the input channel signal tracks 77 and the output channel signal tracks 83 on the first side of the board.

This grouping of the cross-point switching units, and connection of each input channel signal track with only one such unit in each group while connecting each such unit with each output channel signal track, provides a very compact arrangement for obtaining a large switching matrix in which any input line can be connected to any output line using modular cross-point switching units. In addition, the arrangement with the shielding tracks surrounding each of the signal tracks permits the signal tracks to be placed much closer together without cross talk between channels. These features together with the previously described direct connection of the matrix board to the driver board by connectors which eliminates the need for cables between boards, and the plugging in of the matrix and driver board assemblies into the terminal board provides a very efficient arrangement for a routing switcher. The volume of space needed for the matrix controller constructed in accordance with this invention is much less than that required for known routing switchers with comparable switching capacity.

The cross-point switching units 79 on the matrix board 51 are controlled by control signals provided by the digital computer 7 to a logic board 107 over a 25 conductor parallel cable connector 109. The logic board processes the control signals and then distributes them to the matrix boards over a ribbon connector 111 connected to a header 113 on the board. The header 113 distributes the received signals to a dip switch 115, a decoder 117 and a buffer 119. The computer sends the coded commands to all of the boards in the matrix controller. The dip switch 115 is used to identify a particular board, while the decoder determines which cross-point switching unit, if any, on the board the message is for, and the buffer stores the message until an execution strobe is received. The decoded control signals are applied to each of the cross-point switching units 79 on the matrix board 51 through control signal tracks 121. These tracks run generally parallel to the input channel signal tracks 77 and output channel signal tracks 83 under the cross-point switching modules 79. Individual enable signal tracks such as 123 permit the particular cross-point switching unit to which the message is directed to respond to the control signal and perform the appropriate switching action. It will be noticed that the control signal tracks are not shielded since these signals are digital and the signal to noise ratio is not a factor.

Figure 7:
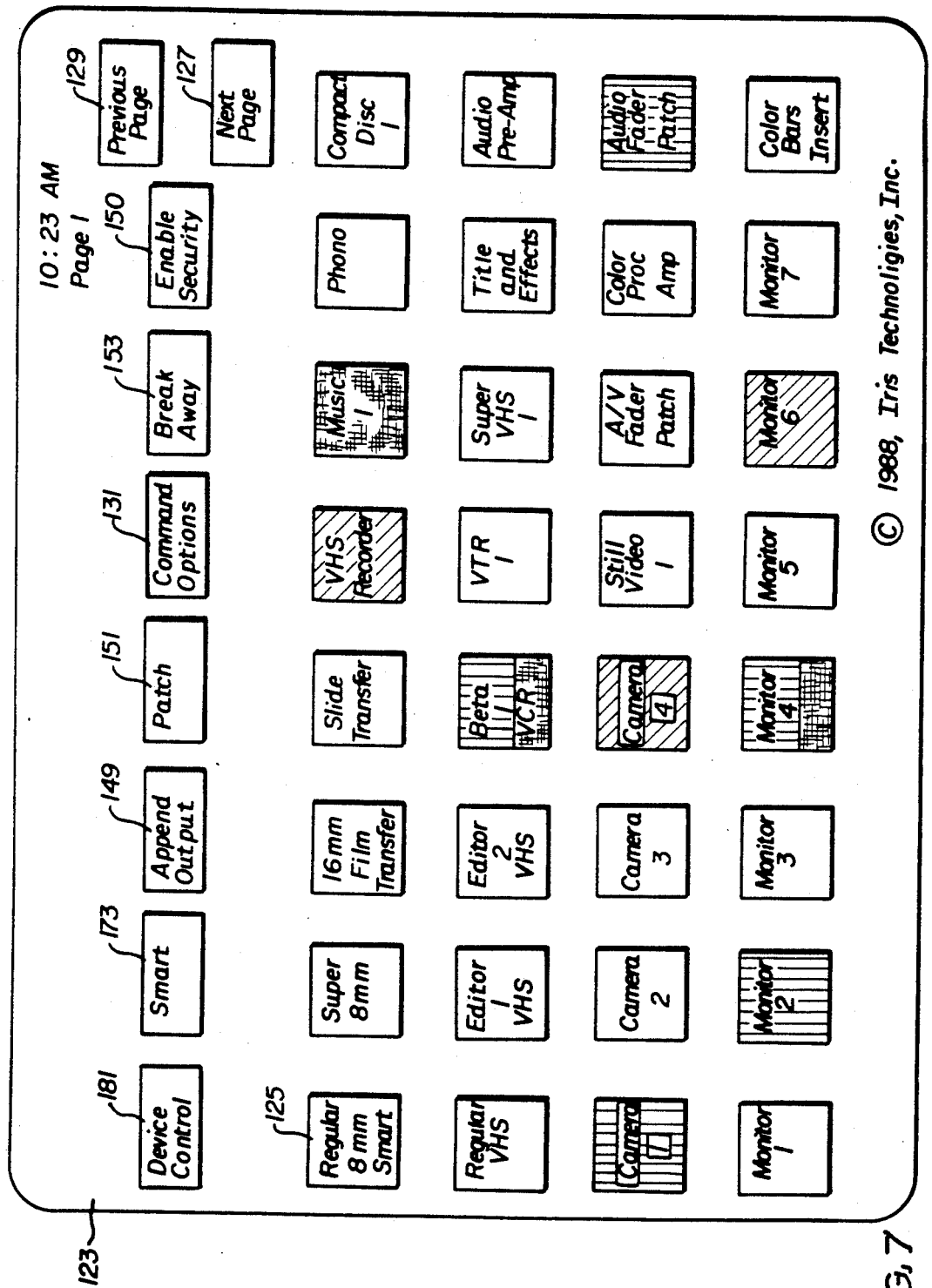
FIG. 7 illustrates the main display screen generated by the computer which forms part of the routing switcher of the invention.

The control signals for operating the cross-point switching units 79 on the matrix boards 51 are generated by the computer 7 as previously mentioned. The computer in turn is controlled by an operator through icons generated on the monitor 11 and selected through a touch screen 13, or alternatively a mouse (not shown). FIG. 7 illustrates the display 123 generated on the monitor 11. The display includes a pattern of device icons 125, which in the exemplary system are shaded boxes representing devices connected to the terminals of the matrix controller 3. A series of shaded rectangular control icons are displayed above the pattern of device icons 125, and will be discussed individually as the operation of the routing switcher is explained.

Only 32 device icons 125 are displayed at one time, however, by touching either the "next page" icon 127 or the "previous page" icon 129 additional patterns of device icons 125 can be called up with the current page indicated in the upper right hand corner of the display.

Figure 8:
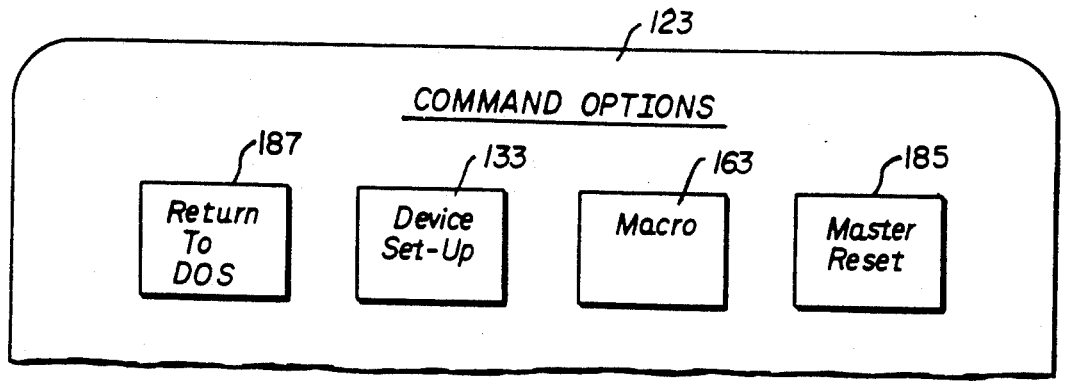
FIG. 8 illustrates the command option menu presented on the display screen.

Assignment of the individual device icons 125 to particular input and output terminals is programmable which provides great flexibility for the routing switcher of the invention. To enter the routine for assigning device icons 125, the "command options" icon 131 is touched. This calls up the command options menu shown in FIG. 8. The pattern of device icons remains on the display; however, only the pertinent part of the display is shown in FIG. 8 for brevity. The "device set-up" icon 133 is then touched to bring up the prompt 135 for setup shown in FIG. 9 which directs the user to touch the device icon 125 to be assigned.

Selection of a device icon 125 to be assigned calls up the setup display shown in FIG. 10. The setup display includes a window 137 within which information is entered through the keyboard 15. This information includes a three line "name" or identifier such as, for instance, "Beta 1 VCR" for the fourth device icon 125 in the second row of the screen shown in FIG. 7. The device can also be identified as "patchable", which will be explained below. The user may then assign the specified device icon to control up to six input terminals and six output terminals. This flexibility permits a single icon to control, for instance, a four line red-green-blue-sync video signal and a left and right audio channel so that all of the signals can be switched simultaneously.

In making an assignment, the user enters the number of the computer parallel port under the column labeled "PRT", and the board and channel or terminal on that board to be controlled by the specified icon under the columns labeled "Bd" and "CH" respectively. For NTSC standard television signals which only require one channel, an entry need only be made for the "composite" channel. For channels not used, zeroes are entes. Some devices, such as a video camera are only input devices, others such as monitors are only output devices, while still others such as a VCR can be both an input and an output device. Whether such latter devices are connected as input or output devices depends upon the sequence in which the device icons are selected as explained next. In the example, the specified icon is assigned to control the composite video input channel and a left and right audio channel for either the input or output of the VCR. The information entered is buffered and the assignment is not made until all the information has been entered and the "complete" icon 139 is touched and released. If it is desired not to complete the assignment, the "exit without save" icon 141 is touched.

Figure 9:
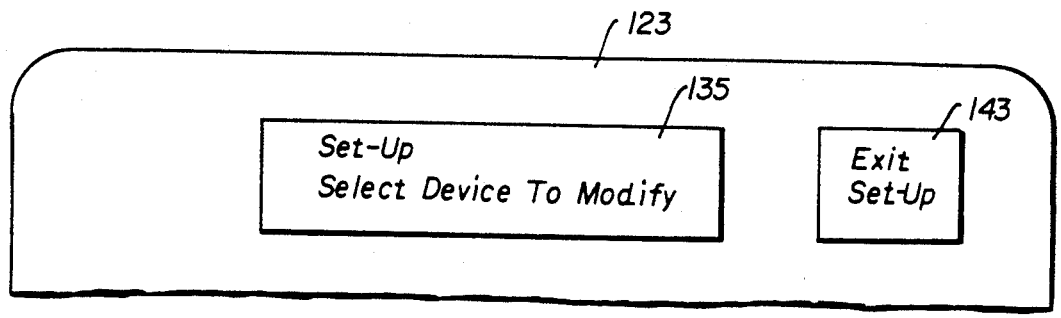
FIG. 9 illustrates the setup prompt display screen.

Touching the "complete" icon 139 or "exit without save" icon 141 recalls the prompt of FIG. 9. An additional icon 125 can then be selected for assignment. When assignment of device icons is completed, the "exit setup" icon 143 is touched to return the display to the screen shown in FIG. 7.

Figure 11:
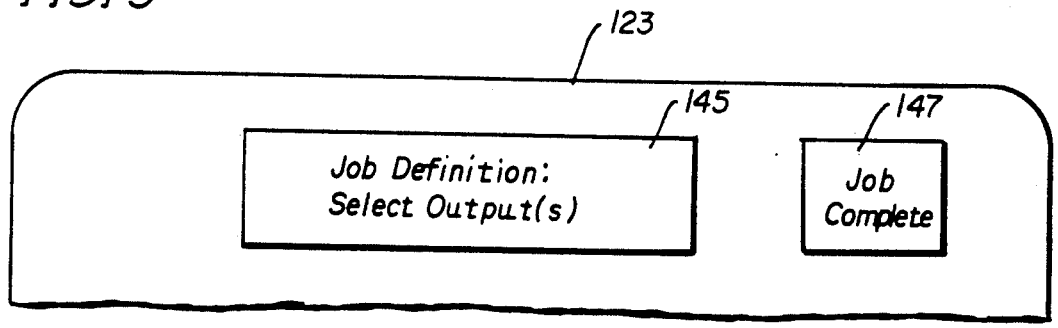
FIG. 11 illustrates the job action display.

In preforming a routing job, one merely touches the device icons on the screen representing the devices to be connected. The first device selected is always considered the source device. Touching the device icon 125 representing the desired source device brings up the display shown in FIG. 11 in which the prompt 145 including the instruction "select output(s)" is presented. It also causes the source icon box to take on a unique color identifying the signal route. For instance, unassigned device icons 125 are blue (not shown as such in the drawings for clarity) but touching the icon labeled "camera 1" causes the icon to take on a red color as shown in FIG. 7. The device associated with each subsequent icon selected becomes a destination device. Thus, touching the "Beta 1 VCR" makes that device a destination for the signals from camera 1 and that icon also becomes red. Touching, for instance, the icons labeled "monitor 2" and "monitor 4" also makes those devices destinations for the signal from camera 1 as indicated in FIG. 7 by the red color of those icons. The lettering on the source icon is white as indicated by the blocks around the letters in FIG. 11 for camera 1 while the lettering on the destination icons is black. These indicia, the color and the lettering, readily identify each separate signal routing and distinguish the source and destination devices. The selection of the icons is buffered until the job is completed by touching the "job complete" icon 147.

With removal of the operator's finger from the "job complete" icon 147, the computer generates four eight bit words which are sent through the parallel ports to the matrix controller for each of the switching addresses or functions to be performed to establish the selected signal route. The first eight bit word for each switching function identifies the board number on the which the switch is located, (determined by dip switch setting 115) the second eight bit word establishes whether the switch is to be turned on or off, the third word identifies what chip or cross-point switching unit 79 the switch is on, and the fourth word identifies the cell in that unit. The computer then sends a strobe for execution of this switching function. Assuming that the camera 1 in the example has a composite television signal and a left and right audio signal, instructions are sent for performing each of these switching functions. Corresponding multiple switching functions must also be performed for each of the destination devices. In addition, switches are turned off which would create conflicts with the selected signal route. For instance, if monitor 2 had been previously assigned to another signal route, those switches would be turned off.

Figure 17:
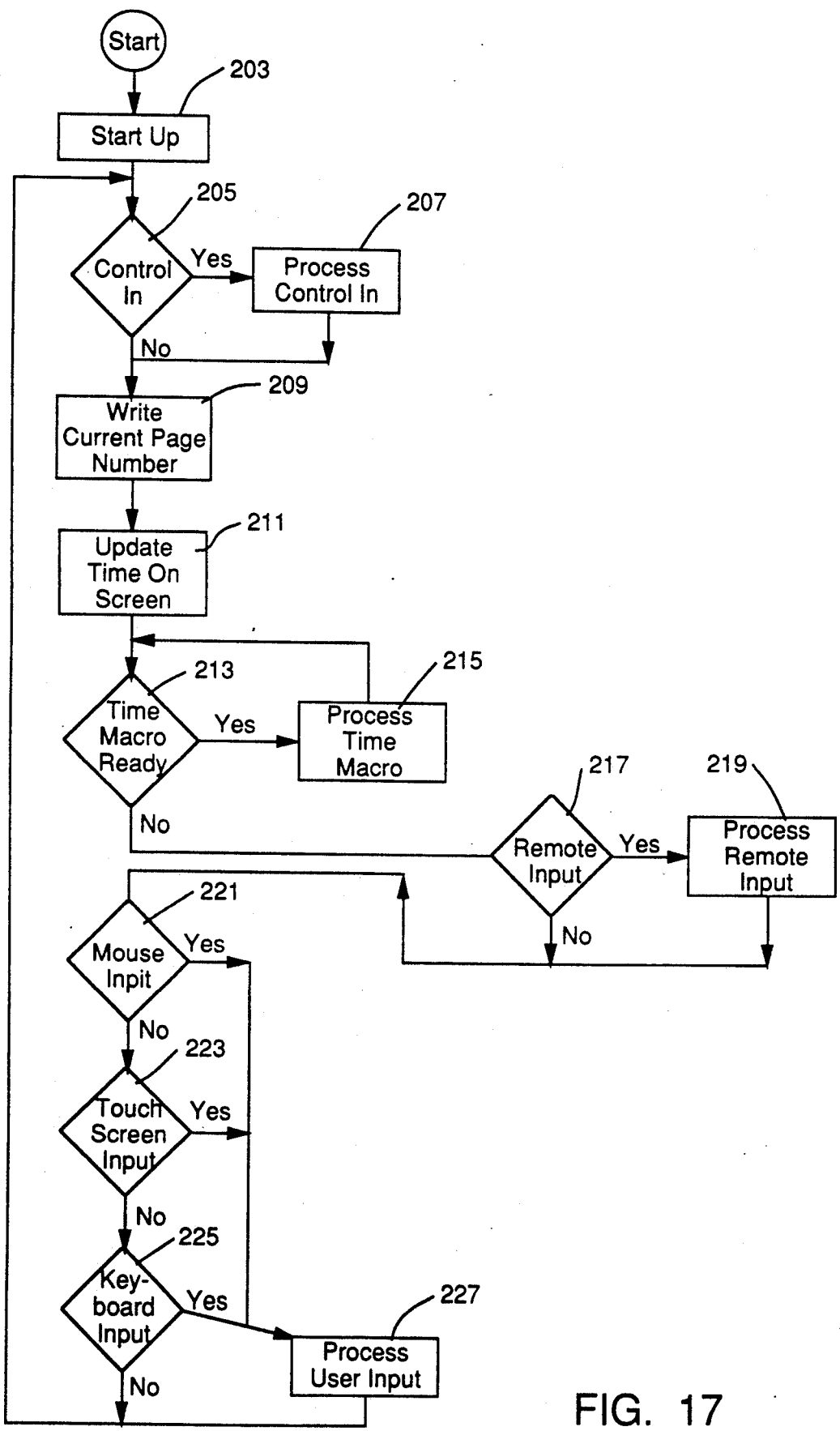

Multiple signal routes can exist simultaneously. For example, as shown in FIG. 17, the icon for camera 4 can be touched making it a source followed by selection of the "VHS recorder" and "monitor 6" icons representing destination devices. The icons 125 associated with this signal route are given a different color, green in the example.

To delete devices from a signal route, the operator merely touches the icon 125 of a completed route representing the device to be eliminated. Upon release of the icon, it returns to a blue color and the switching is effected to remove it from the signal route. If there are multiple destination devices, the remainder of the route stays in tact when a destination device is removed. However, if the source device or the last destination device is delete, the entire route is removed.

In order to avoid inadvertent deletion of a device from a signal route and other unwanted operations, an "enable security" icon 150 shown in FIG. 7 is touched to render the icons ineffective to change signal routes.

Another feature of the routing switcher of the invention, is the append mode which permits the operator to add devices to a signal route. The append mode is entered by touching the "append output" icon 149 shown in FIG. 7. This brings up a "select signal source" prompt (not shown) instructing the operator to touch the source icon for the signal route to be appended. A "select output(s)" prompt (not shown) then requests the operator to touch the icons of the additional devices to be added to the signal route. Again, the selections are buffered until an "append complete" icon (not shown) is touched, whereupon the computer generates the control signals to effect the appendage to the signal route. The icons for added devices assume the color indicia of the route to which they are appended.

Another feature of the invention is the patch function. This function permits the operator to route a signal from a selected source through another device before being distributed to the destination devices. Examples of patchable devices are title generators, audio faders, and special effects generators. Such a device to be patchable must have an input and an output. A device is designated as a patchable device during device setup by entering a "y" for yes in the appropriate block of the setup window shown in FIG. 10.

To enter the patch routine, the patch icon 151 (see FIG. 7) is touched to bring up a "select signal source" prompt (not shown) to designate the source device which is to be patched. For example, assume that the "camera 1" icon is touched. A second prompt (not shown) is then generated which instructs the operator to "select patchable device". For example, assume that the "audio fader patch" icon is touched at this point. This will cause this icon to assume the color of the signal route of the source to be patched, in this instance red as shown in FIG. 7. This selection is buffered, and upon touching and releasing of a patch complete icon (not shown), the computer generates the control signals disconnecting the source from the destinations and reconnecting the source to the input of the patch device and connecting the output of the patch device to the inputs of the destination devices, thus inserting the patch device between the source and the destinations. The patch device can be removed from the signal route and the original signal route reestablished by merely touching the icon of the patch device.

The patch function can also be used internally by the computer to link multiple matrix controllers together. Thus, when a destination is selected in a matrix controller separate from the matrix controller to which the source device is connected, the computer automatically patches the signal through terminals on the two matrix controllers which are connected by a cable.

Figure 12:
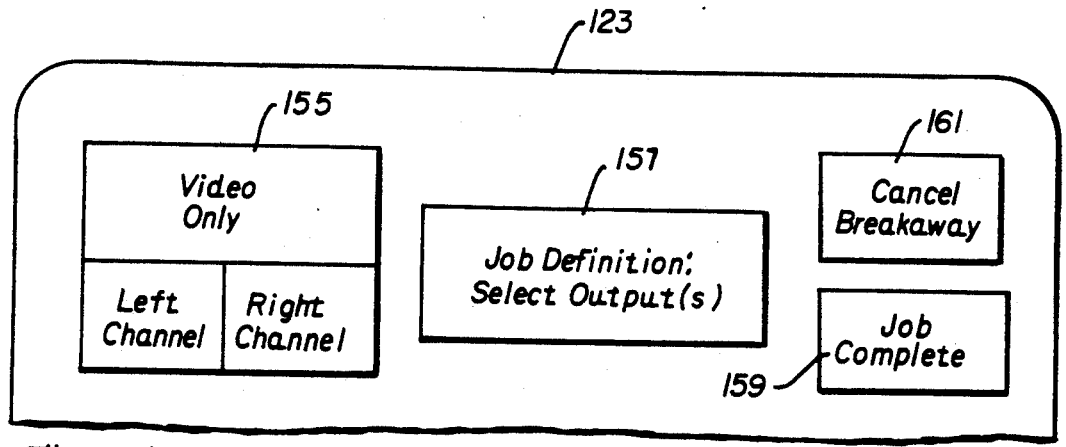
FIG. 12 illustrates the display presented for implementing the breakaway function.

Yet another feature of the routing switcher of the invention is the "breakaway option". This option permits the operator to, for selected destination devices, breakaway from the source and substitute another source. This mode is entered by touching a "breakaway" icon 153 in the main menu shown in FIG. 7. A prompt (not shown) is displayed requesting the user to identify a source on the breakaway. Selection of a breakaway source, for example, "music" in FIG. 7, causes that icon to take on a unique color, yellow in the example. It also causes the upper part of the screen to display the breakaway selection box 155 shown in FIG. 12. Any combination of "video", "left channel" of the audio or "right channel" can be selected for the breakaway by touching the appropriate portion(s) of the icon. Assume for example that the left and right channels of the audio are selected for the breakaway. This brings up the prompt 157 requesting the operator to "select output(s)" to be broken away. Assume in our example that the "Beta 1 VCR" and "monitor 4" are selected. This will cause the lower portion of the icons for the selected devices to change to the color of the breakaway source, in this instance, yellow, as shown in FIG. 7. The breakaway is executed by touching the "job complete" icon 159 in FIG. 12. A breakaway can be cancelled by use of the "cancel breakaway" icon 161.

The routing switcher of the invention also has the capability of storing selected signal routes, called "macros", for later recall. To establish the macros, the "macro" icon 163 is selected from among the command options shown in FIG. 8. This changes the upper part of the screen to the display shown in FIG. 13. In setting up the macros, the "create macro" icon 165 is touched. This brings up a prompt (not shown) directing the operator to type in through the keyboard a desired title for the macro. The operator then selects the desired signal route as described above by first touching the source and then the destination icons on the screen. This signal route is then stored as a macro through selection of a "complete macro" icon (not shown).

Figure 13:
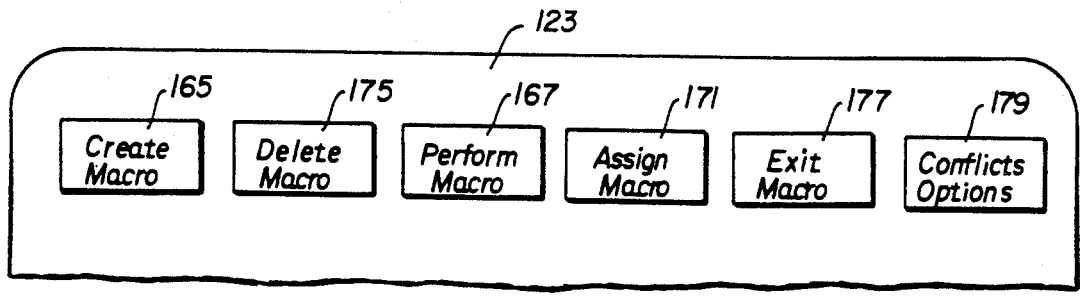
FIG. 13 illustrates the menu presented for storing and implementing stored signal routes.

In order to execute a macro, the "perform macro" icon 167 in FIG. 13 is touched which calls up the list of stored macros as shown in FIG. 13. Touching of the icon such as 169 for a particular macro, results in execution of that signal route. For instance, if the signal route discussed above using camera 1 as the source is made a macro entitled "camera 1", touching of the "camera 1" icon in FIG. 16 results in execution of that signal route which then appears in red as shown in FIG. 7.

Figure 14:
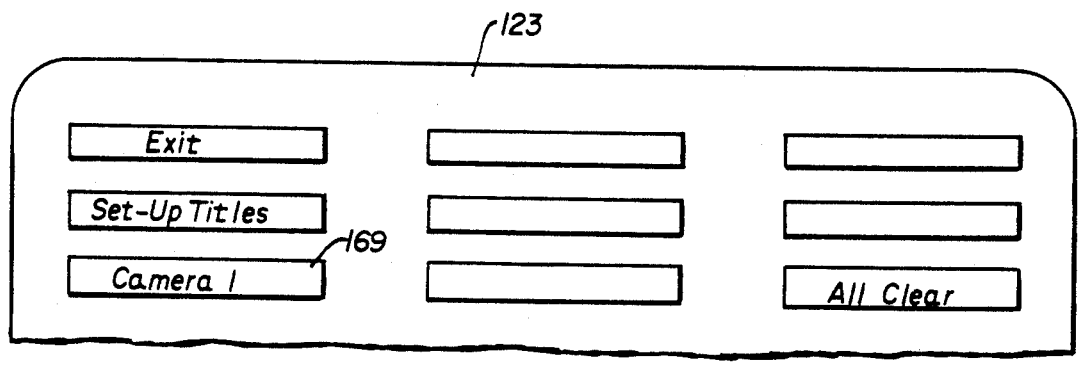
FIG. 14 illustrates the display listing the stored signal routes.

An expedited means of implementing a macro by merely touching one of the icons 125 is also provided. This option is entered by touching the "assigned macro" icon 171 in FIG. 13. This brings up a prompt (not shown) requesting the operator to select one of the icons 125. Selection of such an icon causes the word "smart" to appear in the last line of the icon title as shown by the upper left hand device icon 125 in FIG. 7 labeled "Regular 8 mm SMART" and also calls up the display of FIG. 14. The operator then touches the macro to be assigned to the smart icon and a complete icon (not shown) to store the assignment. When the macro assigned to the smart icon is to be executed, the operator merely touches the "smart" icon 173 on the main menu shown in FIG. 7 which enables the smart function of the device icons 125 which are labeled "smart" and the "smart" icon. Thus, when a "smart" device icon 125 is touched with the "smart" function labeled, the computer generates the control signals needed to implement the assigned macro rather than connecting the device assigned to that device icon to the matrix. A macro can be deleted by selecting the "delete macro" icon 175 on the macro menu of FIG. 13 and then touching the selected macro title 169 as shown in FIG. 14. The macro mode is exited by selecting the "exit macro" icon 177 in FIG. 13. There is a possibility of conflicts where two macros use one or more common devices. These can be resolved by selecting the "conflicts option" icon 179 in FIG. 13. The operator then has a choice in resolving the conflict between skipping a second macro which conflicts with a previously selected macro, or instructing the computer to take the conflicting device for the second selected macro and deleting it from the previous selected macro.

Figure 15:
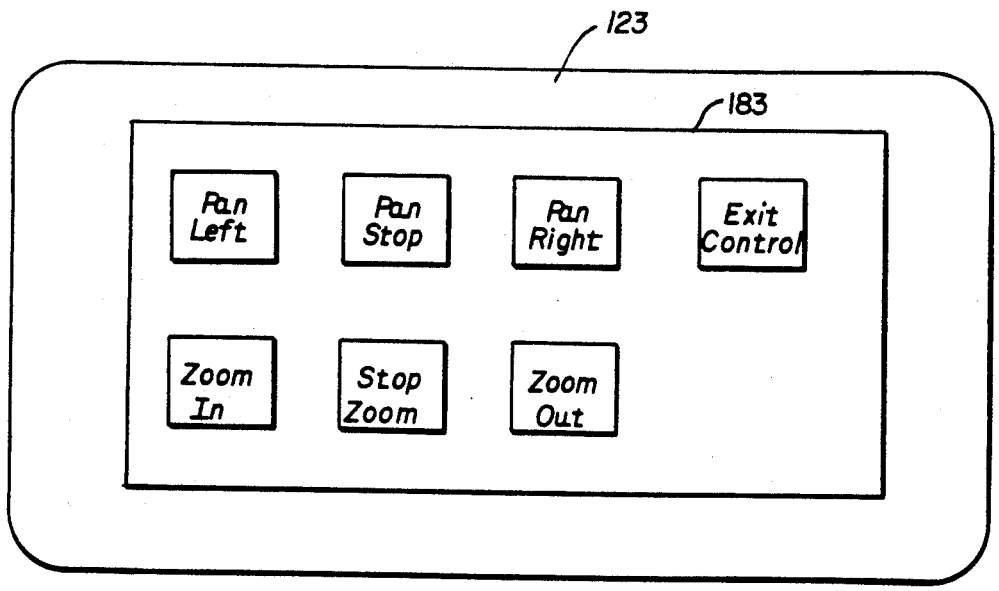
FIG. 15 illustrates a display presented for controlling a selected device connected to the routing switcher of the invention.

Yet another feature of the routing switcher of the invention is the ability to control various devices. This mode is entered by touching the "device control" icon 181 in the main menu shown in FIG. 7. This calls up a prompt (not shown) which directs the operator to select the device to be controlled. Upon touching the selected icon 125, a control display is presented. For example, for a camera, the display shown in FIG. 15 is presented. This display includes a box 183 having icons which when touched will cause the camera to pan or zoom. Icons are provide in the box 183 to stop panning or zooming and to exit the control mode.

Returning to the command options illustrated in FIG. 8, the user may also select a "master reset" icon 185. This master reset function clears out all of the assignments of the device icons and switches all the output channels to a grounded channel. This master reset function would be called, for instance, upon initial installation of the system. The command options also includes a "return to DOS" icon 187 which exits the router switcher programs and returns the host computer to its DOS system.

Figure 16:
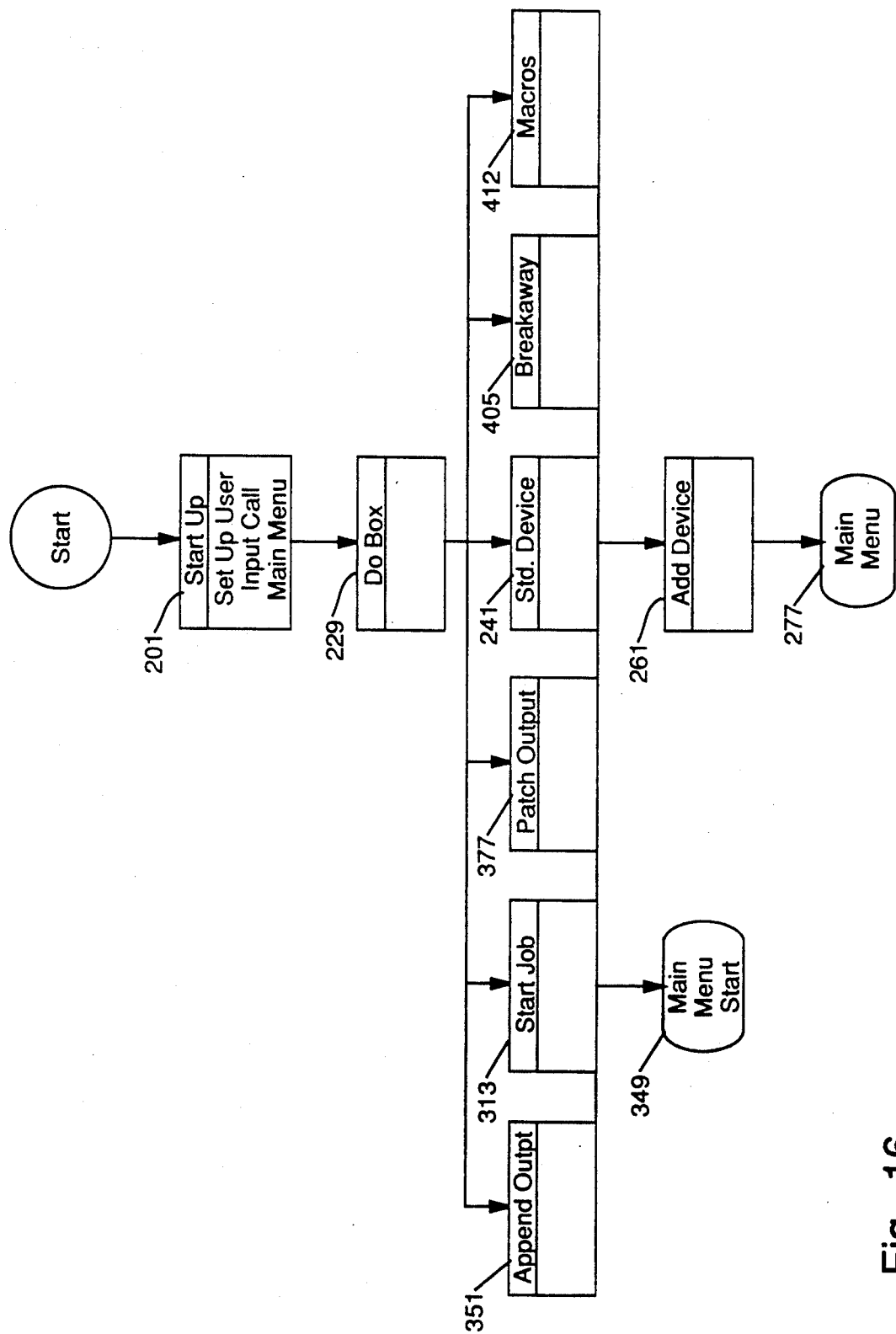

Flowcharts for a suitable program for the microcomputer 7 to implement the invention are shown in FIG. 16 through 34. FIG. 16 is an overall flowchart of the program. It includes a routine, "startup", 201 which sets up the user inputs and calls the main menu which is the display shown in FIG. 7. This "startup" routine is shown in more detail in FIG. 17. Upon initial startup, as indicated at 203, a number of housekeeping chores are performed such as resetting the matrix controller, initializing the mouse or the touch screen which ever is found present, setting up the data files, and reading the files for the stored macro signal routes. It also includes generating the main menu of FIG. 7. The "startup" routine then goes into a loop which is continually repeated. At 205, it looks for control inputs from contact closures, and if any are found processes them at 207. The current page number and the time are generated on the main menu at 209 and 211, respectively. If there are any timed macros as determined at 213, they are processed at 215.

The system is also capable of processing inputs from remote stations, and if any such remote inputs are detected at 217, they are processed at 219. Checks are then made for any inputs through a mouse, a touch screen or the keyboard at 221, 223 and 225, respectively, and any such user input is processed at 227. The microcomputer continuously performs this routine to process input commands.

Figure 18:
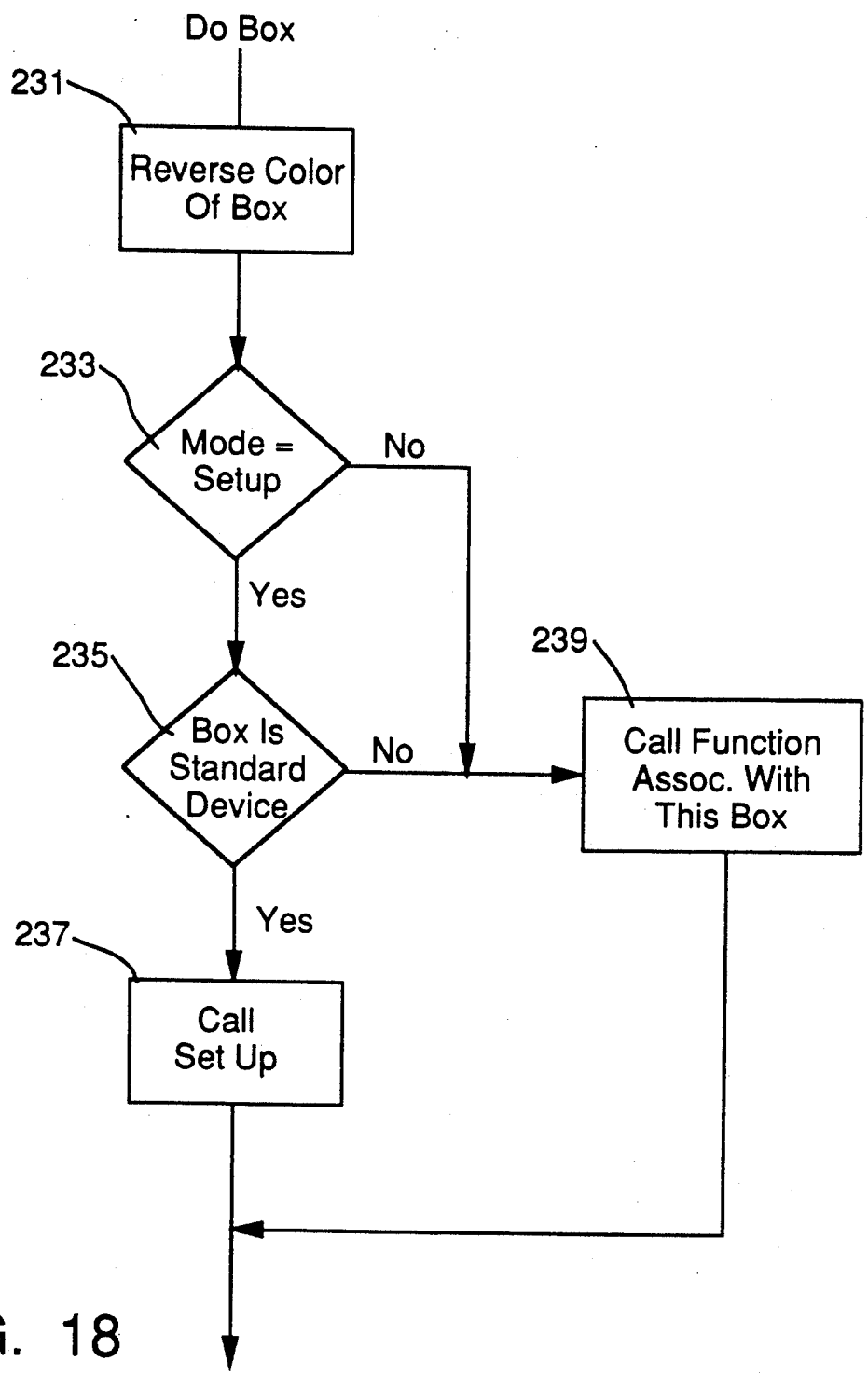

The user inputs are processed through the "do box" routine 229 in the overall flowchart of FIG. 16. The "do box" routine is shown in FIG. 18. The color of the box selected is alternated at 231 to provide feedback to the user that the box selected has, in fact, been recognized by the system. If the setup command option has been selected as determined at 233 and the box is a standard device as determined at 235, the setup display of FIG. 10 is called at 237. Otherwise, the function associated with the selected box is called at 239. This brings us back to the overall flowchart of FIG. 16.

Assume, for the present, that a normal signal routing job is to be performed and that the desired source device icon 125 has been selected as the user input. Under these circumstances, the function associated with the selected box calls the "standard device" routine at 241 in FIG. 16. The "standard device" routine shown in FIG. 19 first checks at 243, 245, 247, and 251 to determine if the system is in a particular mode of operation. Since we are assuming that the selection of a source for a new signal route has been made, the system will not be in any of these operating modes. In the exemplary embodiment of the system, if a device is selected which is already in use, as determined at 253, the latest selection prevails and the device is toggled off from the earlier route at 255. This may require the clean up of orphaned devices at 257, such as for instance, where the device was the source device for another signal route or the only destination device, therefore requiring cancellation of the remainder of the former signal route. In either case, the "add device" routine is called at 259. This is shown in the overall routine also at 261 in FIG. 16.

Figure 20:
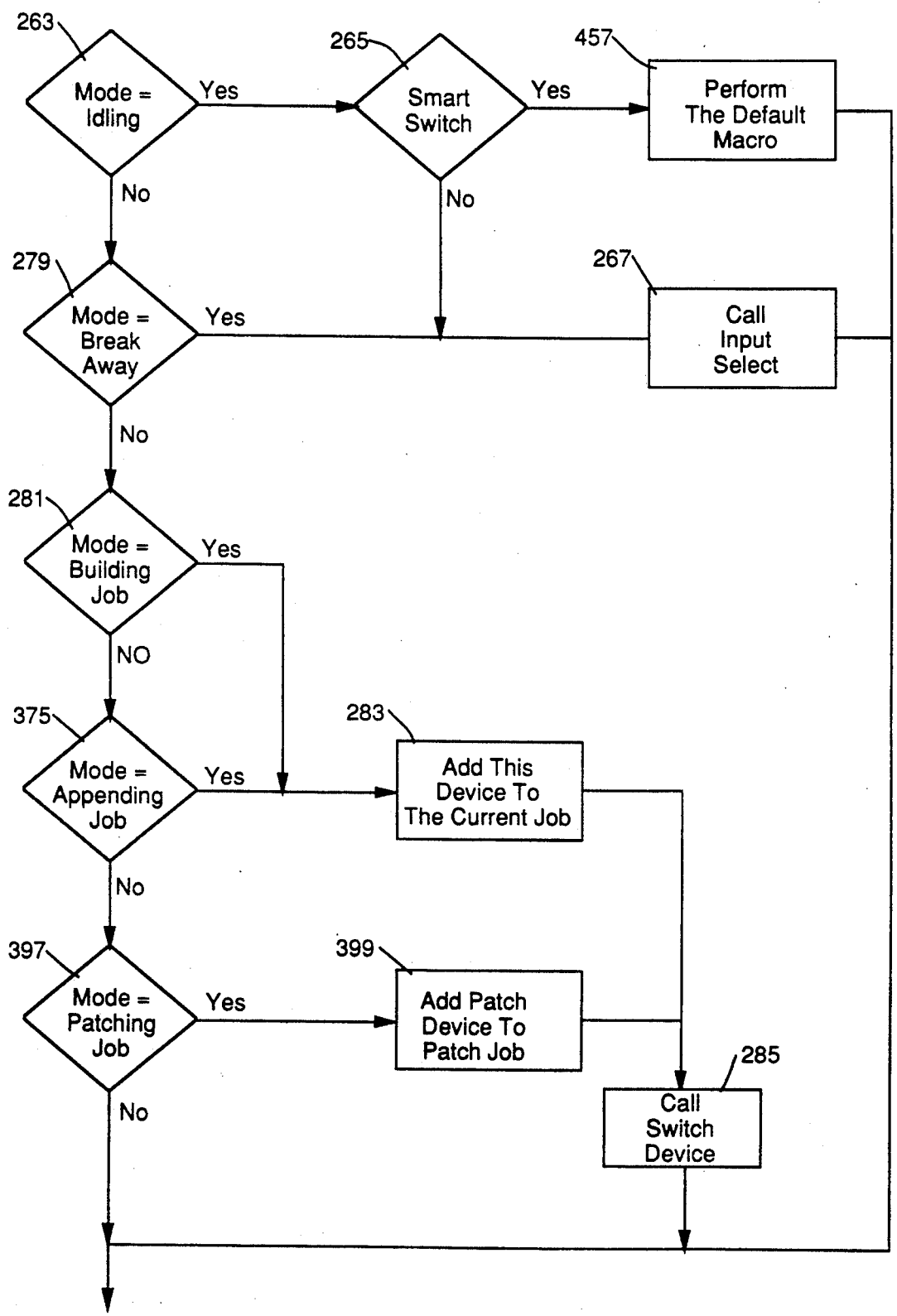
Figure 21:
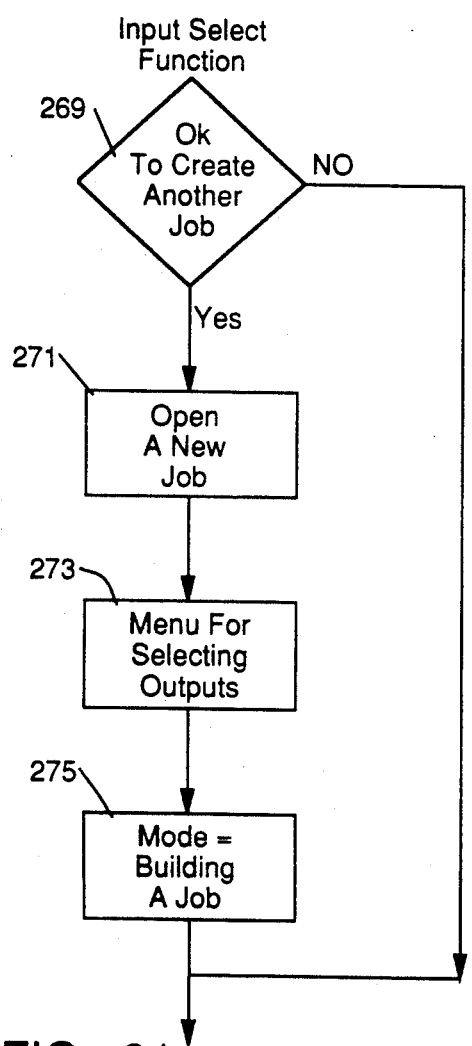

The "add device" routine is shown in FIG. 20. Since, in the example, the selection of the source for a new signal route has been made, the system will be in the "idling" mode as determined at 263 and the touched icon will not be a smart switch as determined at 265, so that the "input select" routine will be called at 267. The "input select" routine, which is shown in FIG. 21, opens a new job at 271 if there are no conflicts as determined at 269, generates the menu for selecting outputs at 273 and changes the mode to "building job" at 275. As shown in the overall flowchart of FIG. 16, the system then returns to the main menu at 277.

When the user touches another device icon 125 to select a destination device for the new signal route, the input is detected in the continuous loop depicted in FIG. 17 which calls the "do box" routine of FIG. 18 to provide the color reversal acknowledging receipt of the input. The "standard device" routine 241 is then entered, and assuming that the newly selected device is not in use, the "add device" routine is called at 259 in FIG. 19. This time, the system is not in the "idling" mode when checked at 263 in FIG. 20. It is also not in the "break away" mode as determined at 279. It is, however, in the "building job" mode as determined at 281 and, hence, this device is added to the current job at 283 and the "switch device" routine is called at 285.

Figure 22:
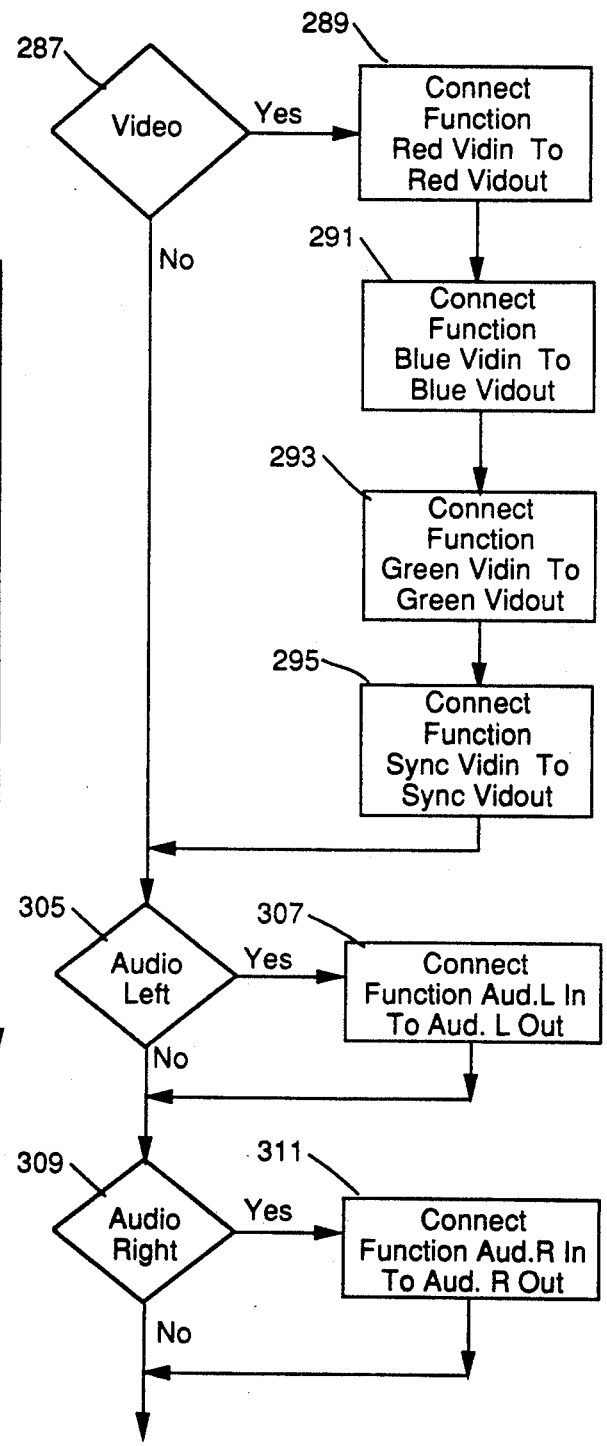

The "switch device" routine is shown in FIG. 22. As illustrated at 287, if the video is to be switched, as it would be except in the case of some break aways, the "connect function" routine is called at 289, 291, 293 and 295 for connecting the red, blue, green and sync or composite video in and video out channels, respectively.

Figure 23:
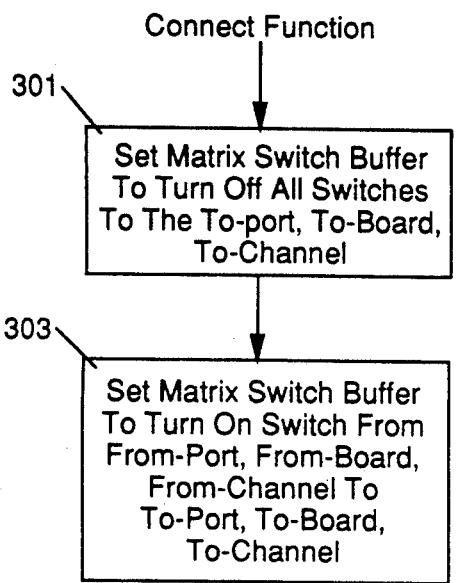

The "connect function" routine is illustrated in FIG. 23. This routine does not actually perform the switching function but sets up in a matrix switch buffer the switches which will be required to be operated to connect the selected destination to the selected source. First, the "connect function" routine sets the matrix switch buffer at 301 to turn off all switches to the destination port, board, and channel. Then, the matrix switch is set at 303 to turn on the switch required to connect the source and destination. Again, the address for this switch is only set in the matrix switch buffer at this point.

Returning to the "switch device" routine of FIG. 22, the audio channels to be switched also call the "connect function" routine as indicated that 305 and 307 for the left channel, and 309 and 311 for the right channel. The "switch device" routine then returns to the "add device" routine which returns to the main menu as indicated at 277 in FIG. 16.

Figure 25:
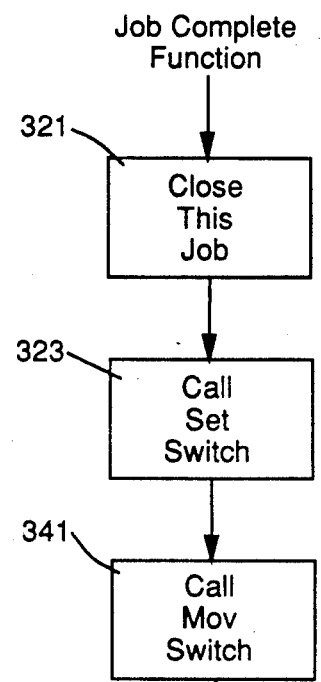
Figure 24:
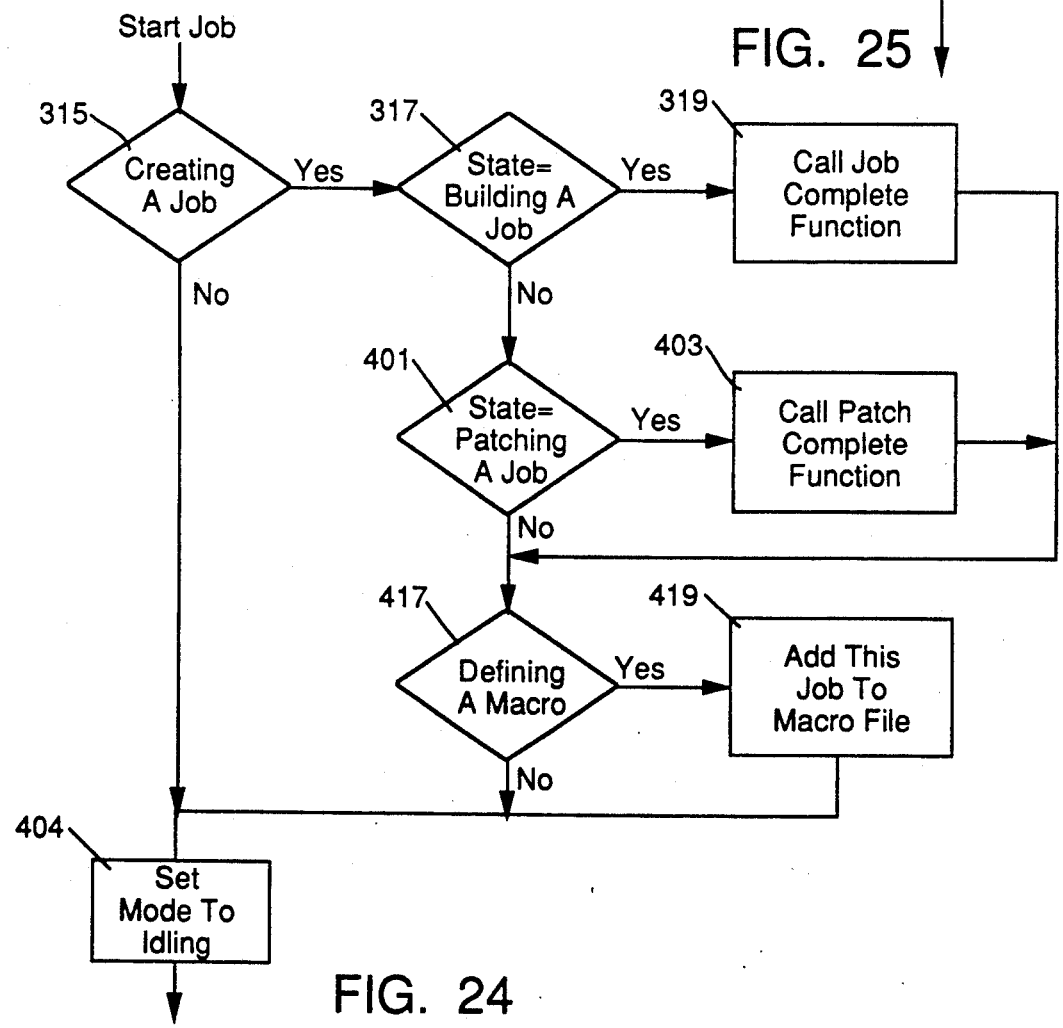
Figure 26:
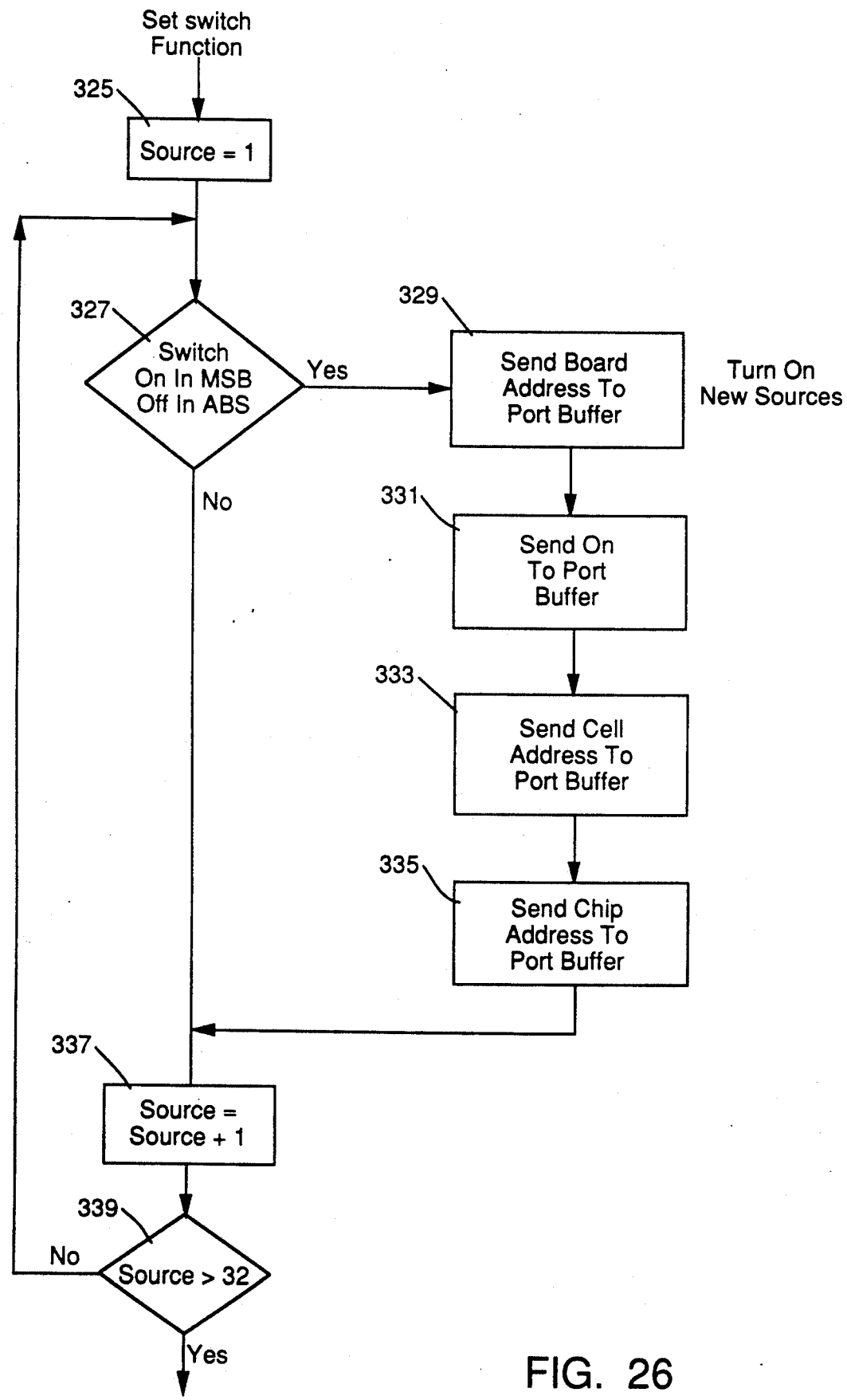

The user may elect additional destinations for the signal route being built in the manner just described. When all of the desired destination devices have been selected, the user presses the "job complete" icon which is detected by the "start-up" routine and passed to the "do box" routine 229 which calls the "start job" routine at 313 in FIG. 16. The "start job" routine is illustrated in FIG. 24. Since a job is being created as determined 315 and the mode is "building job" as determined at 317, the "job complete" function is called at 319. The "job complete" function, which is shown in FIG. 25, closes the job at 321, and calls the "set switch" routine at 323. The "set switch" routine, shown in FIG. 26 sets an index for the devices to one at 325. It then compares the matrix switch buffer with a buffer which stores the actual switch positions at 327, and if the switch is to be on, but is now off, the four word control signal identifying the board, the port, the cell and the chip address are sent to the port buffer as indicated at 329, 331, 333 and 335, respectively. The index is then incremented at 337 and the process is repeated at 339 for each of the other devices. The program then returns to the "job complete" function shown in FIG. 25 which calls the "MOV switch" function at 341. If there are any switches to be changed as determined at 343 in the "MOV switch" function shown in FIG. 27, the switch addresses stored in the port 1 and port 2 buffers are output to the matrix controller at 345 and 347. The program then returns to "start job", and sets the mode to "idling" at 404 before returning to the main menu as indicated at 349 in FIG. 16. This is the operation which sends the appropriate control signals to the matrix controller.

Figures 27, 28:
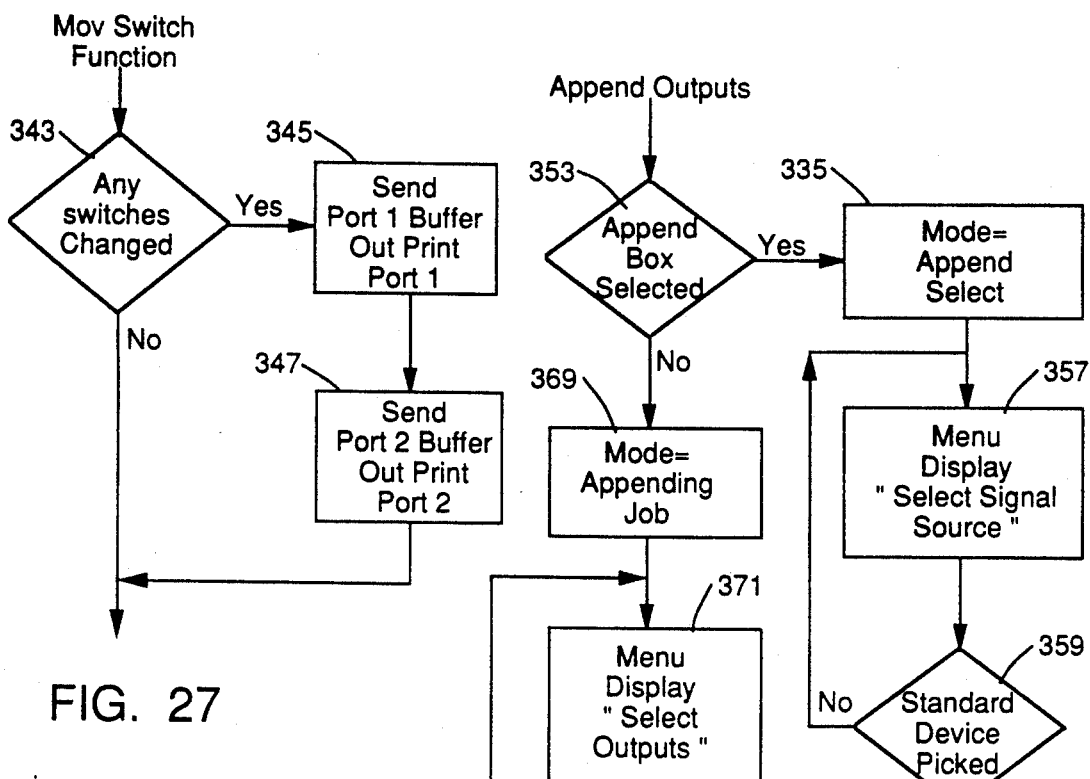

If subsequently the user touches the "append" icon, the "startup" and "do box" routines process the input as previously discussed and the "append output" routine is called at 351 in FIG. 16. As shown in FIG. 28, selection of the "append box" as determined at 353 results in setting of the mode to "append select" at 355, and generates a "select signal source" menu display at 357. When the user touches the device icon indicating the source of the signal route to be appended as determined at 359, the program switches to the "standard device" routine at 361. Turning to the "standard device" routine shown in FIG. 19, it can be seen that since the mode is "append select" as determined at 247, and since the device is in use as determined at 363, the program will return to the "append output" routine at 365. Had the device selected as the source not already been part of a signal route as determined at 363, the "input select" program would have been called at 367 and the process would continue as with the establishment of a new signal route.

Returning to our example, this time when the "append output" routine of FIG. 28 is entered, the append box will not be selected at 353 and hence the mode will be changed to "appending job" at 369. This results in display of the "select outputs" menu at 371. When the device to be added to the existing signal route is selected at 373, the program transfers to the "standard device" routine at 361.

Figure 19:
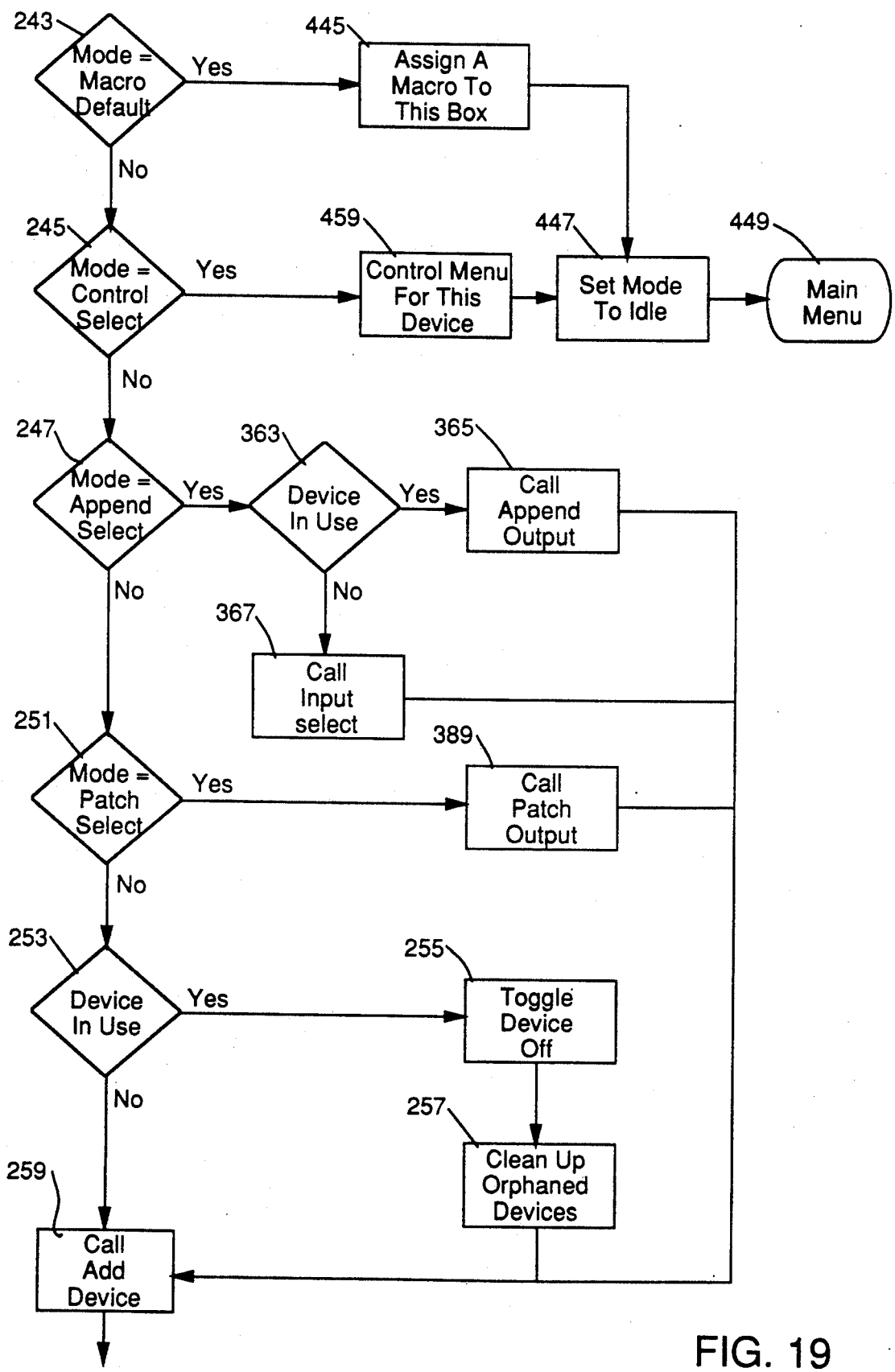

This time the program passes straight through the "standard device" routine of FIG. 19 to call the "add device" routine at 259. Since, at this point, the mode is "appending job" as determined at 375 of the "add device" routine shown in FIG. 20, the selected device is added to the current job at 283 and the "switch device" function is called at 285 as in the case of "building job" and then returns to the main menu at 277 in FIG. 16. When all of the devices to be appended to the selected signal route have been added in similar manner, the "job complete" icon is touched to select the "start job" routine 313 in FIG. 16 which generates the control signals for operating the switching matrix to connect the selected destination devices to the established signal route in the same manner as described above in connection with the establishment of the signal route.

Figure 29:
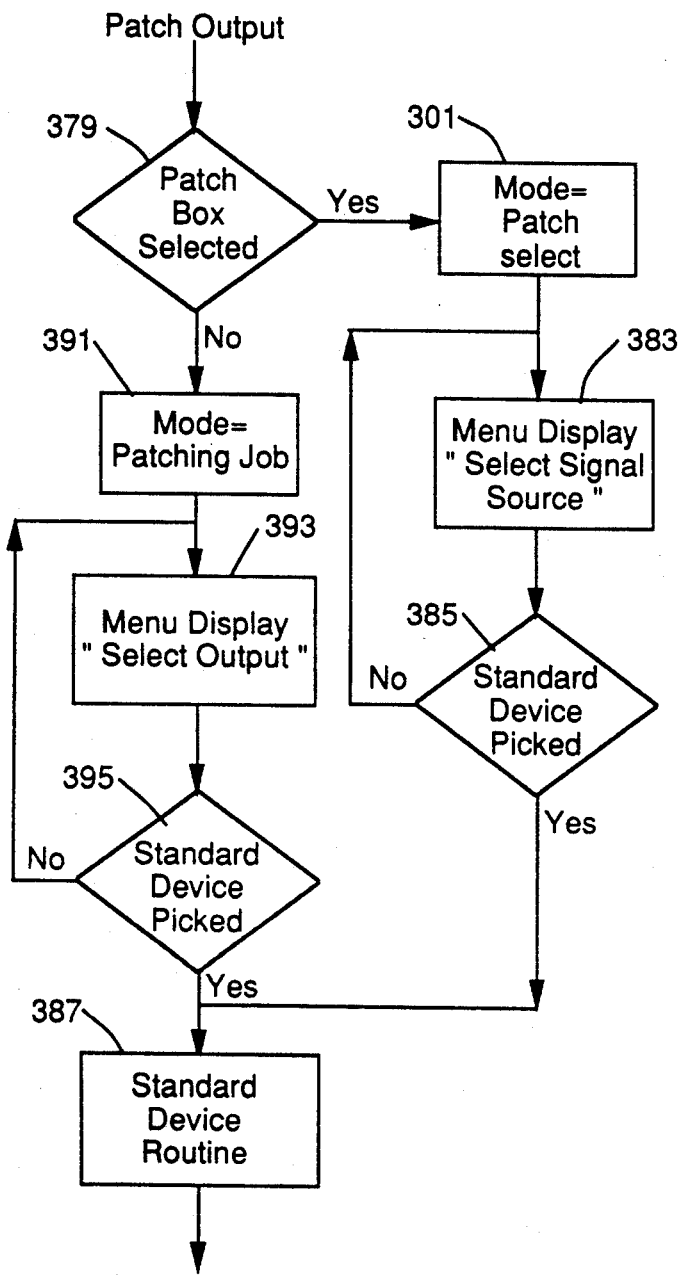

If the user selects the patch icon, the "do box" routine at 229 in FIG. 16 calls the "patch output" routine at 377 which is shown in detail in FIG. 29. On initial selection of the patch icon as detected at 379, the mode is set to "patch select" at 381 and the "select signal source" menu is displayed at 383. Upon selection of the source of the signal route to be patched at 385, the program transfers to the "standard device" routine at 387. Since the mode is "patch select" at 251 in the "standard device" routine of FIG. 19, the "patch output" routine is called at 389. This time, the patch box is not selected at 379 in the "patch routine" of FIG. 29 and the mode is changed to "patching job" at 391. This brings up the "select outputs" menu display at 393 and upon selection of the patch device at 395, the program returns to the "standard device" routine at 387. This time, the program passes straight through the standard device routine of FIG. 19 to call the "add device" routine at 259. Since the program is in the "patching job" mode as determined at 397 of the "add device" routine shown in FIG. 20, the patch device is added to the job at 399 and the "switch device" routine is called at 285.

The patch is implemented by touching the complete job icon which results in the "do box" routine 229 in the overall flow diagram of FIG. 16 calling the "start job" routine 313. With the mode set to "patching job" as determined at 401 in the "start job" routine shown in FIG. 24, the "patch complete" function is called at 403. The "patch complete" function is basically the same as the job complete function shown in FIG. 25 except that it effects disconnecting the source from the destinations of the established signal route and connecting the patch device between the source and the destinations as discussed above. The program then returns to the main menu as indicated at 349 in FIG. 16.

Figure 30:
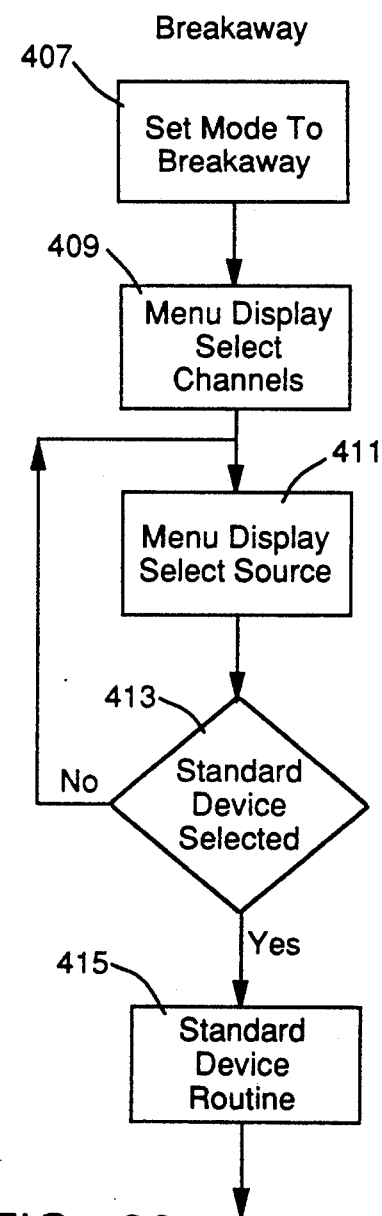

Selection by the user of the break away icon results in the selection of the "break away" routine 405 in FIG. 16 by the "do box" routine 229. The "break away" routine which is shown in FIG. 30 sets the mode to "break away" at 407 and generates the menu display of FIG. 12 for selection of the channels to be broken away as shown at 409 in FIG. 30. The select source menu is then displayed at 411 and when the selection is made at 413 the program transfers to the "standard device" routine at 415.

If the device having the channels which will be broken away, to is use as determined at 253 in the "standard device" routine of FIG. 19, those channels are toggled off as indicated at 255 and the orphans are cleaned up at 257 before the "add device" routine is called at 259. Since the mode is "break away" at 279 in the add device routine of FIG. 20, the "input select" routine is called at 267. As discussed previously, the input select function of FIG. 21, among other things, displays the menu for selecting outputs at 273 and changes the mode to "building job" at 275 before returning to the main menu at 277 in FIG. 16.

Devices having channels which are to be broken away are then selected by touching the appropriate device icon. This results in execution of the "standard device" routine of FIG. 19 which after toggling off the channels to be switched calls the "add device" routine of FIG. 20. At this time, the mode is "building job" as determined at 281 in the "add device" routine resulting in a call of the "switch device" routine at 285. As shown in FIG. 22, the "switch device" routine will only call the "connect function" for those channels to be broken away. Otherwise, the selection of the devices having channels to be broken away is processed in the same manner as the selection of destinations in building a signal route. Accordingly, the required switching is implemented by touching of the job complete icon.

The macro functions are implemented through the "macro" routine shown at 412 in FIG. 16. In creating macros, the name of the macro is typed in through the keyboard and then the same procedure used in establishing a new signal route is followed. When the "start job" routine of FIG. 24 is run, upon completion of the macro, and after the program returns from calling the job complete function at 319, it will be determined at 417 that a macro was being defined and therefore the switching of the macro will be stored in the macro file at 419.

Figure 31:
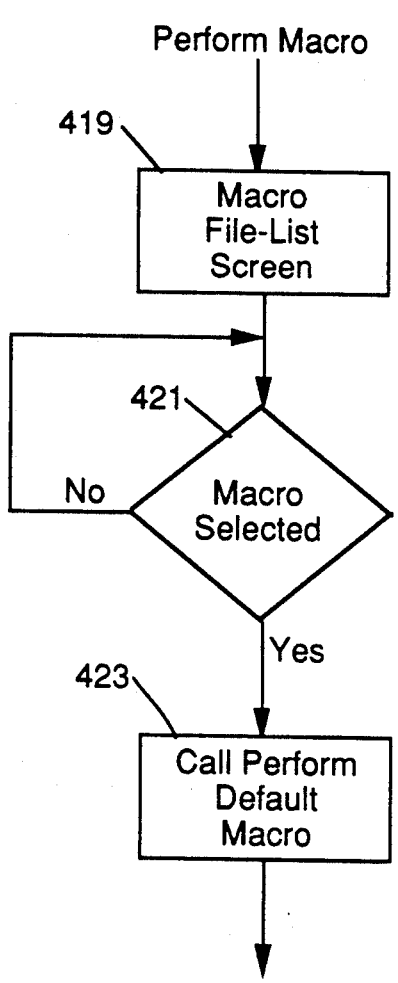
Figure 32:
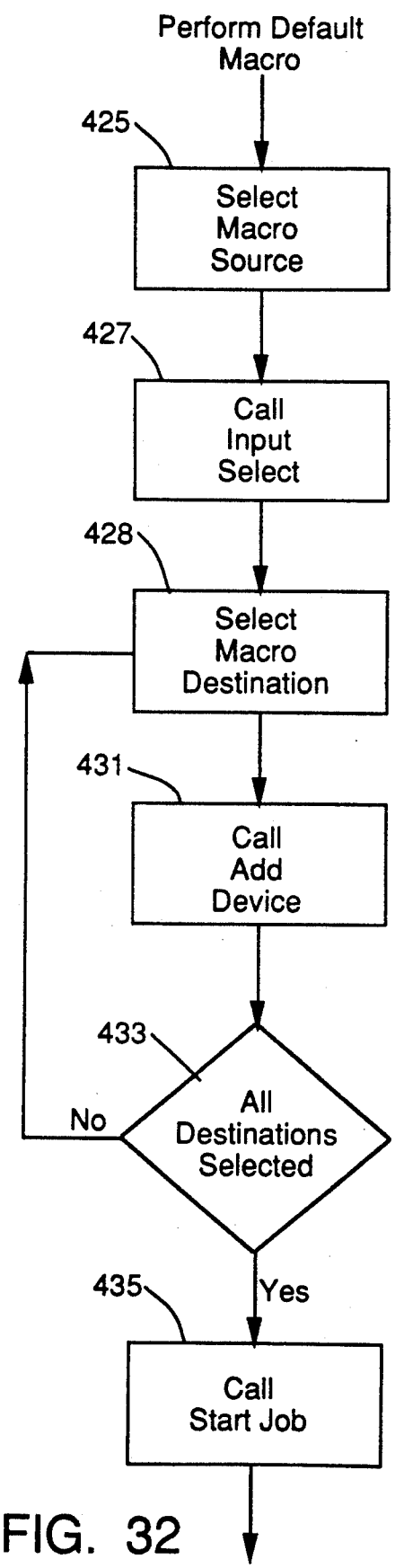

In performing a macro, the "perform macro" routine is entered through the command options. This routine, which is shown in FIG. 31, initially calls up the macro file list as indicated at 419, and when the desired macro has been selected at 421, the "perform default macro" routine is called at 423. The "perform default macro" routine is illustrated in FIG. 32. The source of the selected macro is identified at 425 and the "input select" routine is called at 427. The first destination in the selected macro is then identified at 429 and the "add device" routine is called at 431. Since the input select routine set the mode to "building job", the standard process for adding the selected destination to the signal route being established will be used. This process is repeated at 433 for each of the destinations of the selected macro. When all the destinations have been selected, the "start job" routine will be automatically called at 435 to implement the required switching.

In order to set up the smart function in which one of the standard device boxes is used to implement a macro with a single stroke, the user calls up the "assign macro" routine shown in FIG. 33 through selection of the "assign macros" icon shown in FIG. 13. This will call up the select device prompt as indicated at 437 and when a standard device has been selected at 439, the mode will be set to "macro default" at 441, and the "standard device" routine is called at 443. Since the mode will be "macro default" at 243 in the "standard device" routine shown in FIG. 19, a macro is assigned to the box at 445. The mode is the set to "idle" at 447 and the program returns to the main menu at 449.

To implement a macro using a smart switch, the user selects the "smart" icon shown in FIG. 7 which brings up the "smart" routine shown in FIG. 34. This program generates the select smart switch prompt at 451 and when the smart switch has been selected at 453 calls the "standard device routine at 455. The program will pass through the standard device routine of FIG. 19 and call the "add device" routine at 259. Since, as shown in FIG. 20 the mode is "idling" at 263 and a smart switch has been selected, as determined at 265, the "perform default" macro routine of FIG. 32 is called at 457.

When the user selects the "device control" icon in FIG. 7, the mode is set to "control select". The user then selects the device to be controlled and the "standard device" routine of FIG. 19 is entered. Detection of the "control select" mode at 245 results in presentation of the control menu for this device as indicated at 459. When control of the device is terminated, the mode is set to "idle" at 447 and the program returns to the main menu at 459.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A routing switcher for connecting selected source devices with selected destination devices:
   a plurality of terminals assigned as source terminals to each of which a source device is connectable;
   a plurality of terminals assigned as destination terminals to each of which a destination device is connectable;
   a cross-point switching matrix selectively connecting selected destination terminals to selected source terminals in response to control signals;
   a display device displaying a plurality of device icons;
   input means through which icons on said display device are selected; and
   a digital computer connected to said cross-point switching matrix, said display device and said input means and programmed to assign selected of said device icons on the display device to selected source terminals as source icons and to assign other of said device icons to selected destination terminals as destination icons, and to be responsive to the subsequent selection of a source icon and a destination icon to generate control signals operating said cross-point switching matrix to connect the selected source terminal to the selected destination terminal to form a signal route.

2. The routing switcher of claim 1 wherein said digital computer is programmed to generate control signals operating said cross-point switching matrix to connect the selected source terminal to each of a plurality of destination terminals represented by destination icons selected through said input means.

3. The routing switcher of claim 2 wherein said digital computer is further programmed to in response to reselection of a selected destination icon to generate a control signal operating said cross-point switching matrix to disconnect the destination terminal assigned to said reselected destination icon from the signal route.

4. The routing switcher of claim 3 wherein said digital computer is further programmed in response to reselection of a source icon or the last destination icon in the signal route to generate control signals operating the cross-point switching matrix to disconnect the source and all of the destination terminals to which device icons in the signal route are assigned.

5. The routing switcher of claim 1 wherein said digital computer is programmed to generate control signals connecting each of a plurality of selected source terminals represented by source icons selected through said input means to a different at least one selected destination terminal represented by a destination icon selected through said input means, whereby plural source terminals are connected to destination terminals at the same time to form plural separate signal routes.

6. The routing switcher of claim 5 wherein said digital computer is further programmed to generate separate route identifying indicia on the icons on said display device visually identifying the icons associated with each of the plural separate signal routes.

7. The routing switcher of claim 5 wherein said digital computer is further programmed to assign a selected device icon on the display device to both at least one source terminal and at least one destination terminal and to generate control signals operating said cross-point switching matrix to connect all of the source terminals to which the selected device icon is assigned to the matrix when said selected device icon is selected as the first device icon for a signal route and to generate control signals operating said cross-point switching matrix to connect in the matrix all of the destination terminals to which the selected icon is assigned when said selected device icon is selected other than first in establishing a signal route.

8. The routing switcher of claim 7 wherein said display device also displays a job complete icon selectable through said input means, wherein said digital computer is programmed in response to selection of said complete job icon through said input means to assign the next device icon selected as the source icon for another signal route, and to generate control signals operating the cross-point switching matrix to connect the at least one source terminal to which the next device icon is assigned to the matrix, and to generate in response to selection of additional device icons control signals operating the cross-point switching matrix to connect each of the at least one destination terminals to which said additional device icons are assigned to the matrix until said complete job icon is again selected.

9. The routing switcher of claim 8 wherein said digital computer is programmed to store said control signals generated in response to the selection of device icons in a buffer, and in response to selection of said job complete icon to send said control signals stored in said buffer to said cross-point switching matrix to operate said matrix to connect the at least one source terminal to which said next device icon is assigned to each of the at least one destination terminals to which said additional device icons are assigned to implement said another signal route.

10. The routing switcher of claim 8 wherein said display device also displays an append icon selectable through said input means and wherein said digital computer is further programmed in response to selection of said append icon and a source icon which forms part of a designated signal route, to generate control signals operating said cross-point switching matrix to add to the designated signal route additional destination terminals represented by additional destination icons selected through the input means.

11. The routing switcher of claim 5 wherein said display device includes control icons selectable by said input means to implement selected operating modes and wherein said digital computer is programmed to respond to selection of a control icon to generate said control signals operating said cross-point switching matrix in accordance with the selected operating mode.

12. The routing switcher of claim 11 wherein said control icons include an append icon and wherein said digital computer is programmed in response to selection of said append icon and a source icon which forms part of a designated signal route to generate control signals connecting the source terminal represented by the selected icon with the terminals represented by each additional destination icon selected through said input means.

13. The routing switcher of claim 12 wherein said digital computer is programmed to store selected signal routes each comprising a source terminal, at least one destination terminal, and an assigned macro icon for selecting that route and when said macro icon for one of said stored routes is selected, to generate control signals operating said cross-point switching matrix to connect the source terminal to all of said destination terminals in the selected stored signal route without individual selection through said input means of the assigned source and destination icons.

14. The routing switcher of claim 13 wherein said assigned macro icon is a device icon assigned as a smart icon which device icon is also assigned as a source or destination icon, and wherein said command icons include a smart enable icon, said digital computer being programmed to respond to selection of said smart icon when said smart enable icon has been selected to generate control signals operating the cross-point switching matrix to connect the terminals of the stored signal route represented by said smart icon, and when said smart enable icon has not been selected, to respond to selection of said smart icon as a source or destination icon in generating control signals for operating said cross-point switching matrix.

15. The routing switcher of claim 1 for use with a patch device wherein said display device further displays a patch icon assigned to both a source terminal and a destination terminal with the destination terminal assigned to the patch icon connected to the input of the patch device and the source terminal assigned to the patch icon connected to the output of the patch device, and wherein said digital computer is further programmed to, in response to the selection of the patch icon, to generate control signals operating said cross-point switching matrix to disconnect the selected destination from the selected source and instead to connect the selected source terminal to the destination terminal assigned to the patch device and to connect the selected destination terminal to the source terminal assigned to the patch device, whereby a signal patch route is established from he selected source terminal through the patch device to the selected destination terminal.

16. The routing switcher of claim 15 wherein said digital computer is further programmed to generate control signals operating said cross-point switching matrix to connect additional destination terminals represented by destination icons selected through said input means to said source terminal assigned to the patch device.

17. The routing switcher of claim 16 wherein said digital computer is programmed to store selected signal routes each comprising a source terminal, at least one destination terminal, and an assigned macro icon for selecting that route and when said macro icon for one of said stored routes is selected, to generate control signals operating said cross-point switching matrix to connect the source terminal to all of said destination terminals in the selected stored signal route without individual selection signals operating said cross-point switching matrix to connect additional destination terminals represented by destination icons selected through said input means to said source terminal assigned to the patch device.

18. The routing switch of claim 1 wherein said digital computer is further programmed to assign a source icon designated through said input means as a multi-channel source icon assigned to a set of said source terminals, to assign a destination icon designated through said input means as a multi-channel destination icon assigned to a set of destination terminals, and in response to subsequent selection of said multi-channel source icon and said multi-channel destination icon through said input means to generate control signals operating said cross-point switching matrix to connect each individual source terminal in said set of source terminals to a separate individual destination terminal in said set of destination terminals to form a multi-channel signal route.

19. The routing switcher of claim 18 wherein said digital computer is further programmed to assign additional destination icons as multi-channel destination icons each assigned to a separate set of destination terminals, and in response to the subsequent selection of plural multi-channel destination icons to generate control signals operating said cross-point switching network to connect each destination terminal in each separate set of destination terminals represented by said plural multi-channel destination icons to one of the terminals in said set of source terminals.

20. The routing switcher of claim 19 wherein said multiple terminals assigned to said multi channel source icon and multi channel destination icons include terminals for video channels and left and right audio channels, and wherein said digital computer is further programmed to generate a breakaway display by which at least one of said channels can be selected through said input means, and in response to selection of a new source icon and at least one destination icon in the multi channel signal route to generate control signals operating said cross point switching matrix to disconnect the terminals assigned to the selected destination for the selected channel icons from the multi channel source icon and to connect those terminals assigned to the selected destination icons for that channel instead to the terminals corresponding channel assigned to the new source icon.

* * * * *